(12) United States Patent
Cha et al.

(10) Patent No.: US 10,333,035 B2
(45) Date of Patent: Jun. 25, 2019

(54) METHOD OF MANUFACTURING LIGHT EMITTING DEVICE PACKAGE

(71) Applicant: SAMSUNG ELECTRONICS CO., LTD., Suwon-si (KR)

(72) Inventors: Nam Goo Cha, Hwaseong-si (KR); Sung Hyun Sim, Uiwang-si (KR); Wan tae Lim, Suwon-si (KR); Hye Seok Noh, Suwon-si (KR); Hanul Yoo, Goyang-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 192 days.

(21) Appl. No.: 15/337,215

(22) Filed: Oct. 28, 2016

(65) Prior Publication Data

US 2017/0250318 A1 Aug. 31, 2017

(30) Foreign Application Priority Data

Feb. 25, 2016 (KR) .................. 10-2016-0022495

(51) Int. Cl.
  *H01L 33/50* (2010.01)
  *H01L 33/60* (2010.01)
  *H01L 27/15* (2006.01)

(52) U.S. Cl.
  CPC .......... *H01L 33/505* (2013.01); *H01L 33/504* (2013.01); *H01L 27/153* (2013.01);
  (Continued)

(58) Field of Classification Search
  CPC ....... H01L 33/502; H01L 33/44; H01L 33/60; H01L 33/62; H01L 27/15;
  (Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

CN 102403424 A 4/2012
JP 9113717 A 5/1997
(Continued)

OTHER PUBLICATIONS

Communication dated Jun. 29, 2018, issued by the State Intellectual Property Office of the People's Republic of China in counterpart Chinese Patent Application No. 201710107360.5.

*Primary Examiner* — Charles D Garber
*Assistant Examiner* — S M Sohel Imtiaz
(74) *Attorney, Agent, or Firm* — Sughrue Mion, PLLC

(57) ABSTRACT

A method of manufacturing a light emitting device package is provided. The method includes preparing a film strip including one or more light blocking regions and one or more wavelength conversion regions, preparing light emitting devices, each including one or more light emitting regions, bonding the film strip to the light emitting devices so as to dispose the one or more wavelength conversion regions on the one or more light emitting regions of each of the light emitting devices, and cutting the film strip and the light emitting devices into individual device units.

13 Claims, 22 Drawing Sheets

(52) U.S. Cl.
CPC ...... *H01L 33/60* (2013.01); *H01L 2933/0033* (2013.01); *H01L 2933/0041* (2013.01)

(58) Field of Classification Search
CPC ..... H01L 2933/0066; H01L 2933/0025; H01L 2933/0041; H01L 2933/0058
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2005/0134168 A1 | 6/2005 | Lee | |
| 2009/0116249 A1* | 5/2009 | Cho | B29C 33/42 362/351 |
| 2011/0096045 A1* | 4/2011 | Ito | G09F 9/33 345/204 |
| 2013/0100643 A1 | 4/2013 | Farchtchian et al. | |
| 2013/0329440 A1 | 12/2013 | Tsutsumi et al. | |
| 2014/0002507 A1 | 1/2014 | Ben-Chorin et al. | |
| 2014/0029297 A1 | 1/2014 | Watabe et al. | |
| 2014/0151726 A1 | 6/2014 | Maeda et al. | |
| 2014/0264420 A1* | 9/2014 | Edwards | F21V 13/02 257/98 |
| 2014/0319553 A1* | 10/2014 | Ye | H01L 33/0004 257/89 |
| 2015/0136306 A1* | 5/2015 | Wakamatsu | G02B 5/00 156/67 |
| 2015/0241003 A1 | 8/2015 | Ikami | |
| 2016/0044753 A1* | 2/2016 | Lee | H05B 33/086 315/185 R |
| 2016/0118554 A1* | 4/2016 | Akram | H01L 33/0079 438/27 |
| 2016/0254315 A1* | 9/2016 | Furuta | H01L 27/153 257/91 |
| 2017/0062671 A1* | 3/2017 | Hashimoto | H01L 33/507 |

FOREIGN PATENT DOCUMENTS

| | | |
|---|---|---|
| JP | 2014017459 A | 1/2014 |
| JP | 2015161581 A | 9/2015 |
| KR | 1020050052243 A | 6/2005 |
| WO | 2014/188296 A1 | 11/2014 |

\* cited by examiner

METHOD OF MANUFACTURING LIGHT EMITTING DEVICE PACKAGE

CROSS-REFERENCE TO RELATED APPLICATION

This application claims priority from Korean Patent Application No. 10-2016-0022495, filed on Feb. 25, 2016 in the Korean Intellectual Property Office, the disclosure of which is incorporated by reference herein in its entirety.

BACKGROUND

1. Field

The present disclosure relates to a light emitting device package.

2. Description of Related Art

Semiconductor light emitting devices have come to prominence as next-generation light sources due to having inherent advantages such as relatively long lifespans, low power consumption, fast response speeds, environmental friendliness, and the like. Semiconductor light emitting devices have come to prominence as important sources of light in various types of products, such as lighting devices and backlights of displays. In particular, a nitride-based light emitting device based on a Group III nitride such as GaN, AlGaN, InGaN, or InAlGaN may serve an important function in outputting blue or ultraviolet light as a semiconductor light emitting device.

Accordingly, as the use of a light emitting diode (LED) extends into various fields for the purpose of a lighting device, a compact light emitting device package has been demanded in order to secure a degree of design freedom to realize various applications.

SUMMARY

It is an aspect to provide a method of manufacturing a compact light emitting device package by which various colors of light may be implemented.

According to an aspect of an example embodiment, a method of manufacturing a light emitting device package includes: preparing a film strip including at least one light blocking region and at least one wavelength conversion region; preparing light emitting devices, each including at least one light emitting region; bonding the film strip to the light emitting devices so as to dispose the at least one wavelength conversion region on the at least one light emitting region of each of the light emitting devices; and cutting the film strip and the light emitting devices into individual device units.

According to an aspect of another example embodiment, a method of manufacturing a light emitting device package may include: alternately forming a plurality of light blocking layers and a plurality of wavelength conversion layers on a base film; cutting the plurality of light blocking layers and the plurality of wavelength conversion layers to prepare a film strip including a plurality of light blocking regions and a plurality of wavelength conversion regions; preparing light emitting devices each including at least one light emitting region; bonding the film strip to the light emitting devices to allow a section of the film strip to face light emitting surfaces of the light emitting devices; and cutting the film strip and the light emitting devices into individual device units.

According to an aspect of another example embodiment, a method of manufacturing a light emitting device package may include manufacturing, separately from a light emitting structure, a film strip including at least three wavelength conversion regions that are separated from one another by light blocking regions; bonding the film strip to the light emitting structure, such that the wavelength conversion regions align to cover at least one light emitting region of the light emitting structure; and cutting the film strip bonded to the light emitting structure into individual device units.

BRIEF DESCRIPTION OF DRAWINGS

The above and other aspects, features, and advantages will be more clearly understood from the following detailed description of example embodiments taken in conjunction with the accompanying drawings, in which.

DETAILED DESCRIPTION

Example embodiments will now be described in detail with reference to the accompanying drawings.

Figure 1:
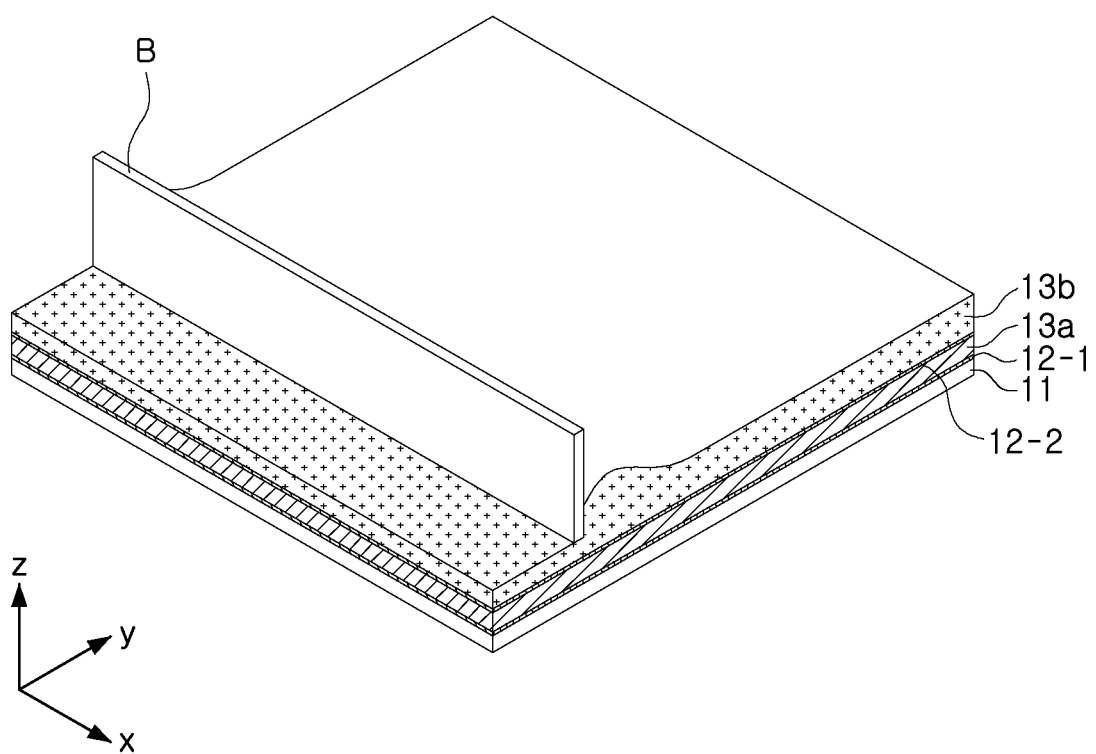
FIGS. 1, 2 and 3 are views illustrating a film strip employed in a method of manufacturing a light emitting device package according to example embodiments, respectively.
Figure 2:
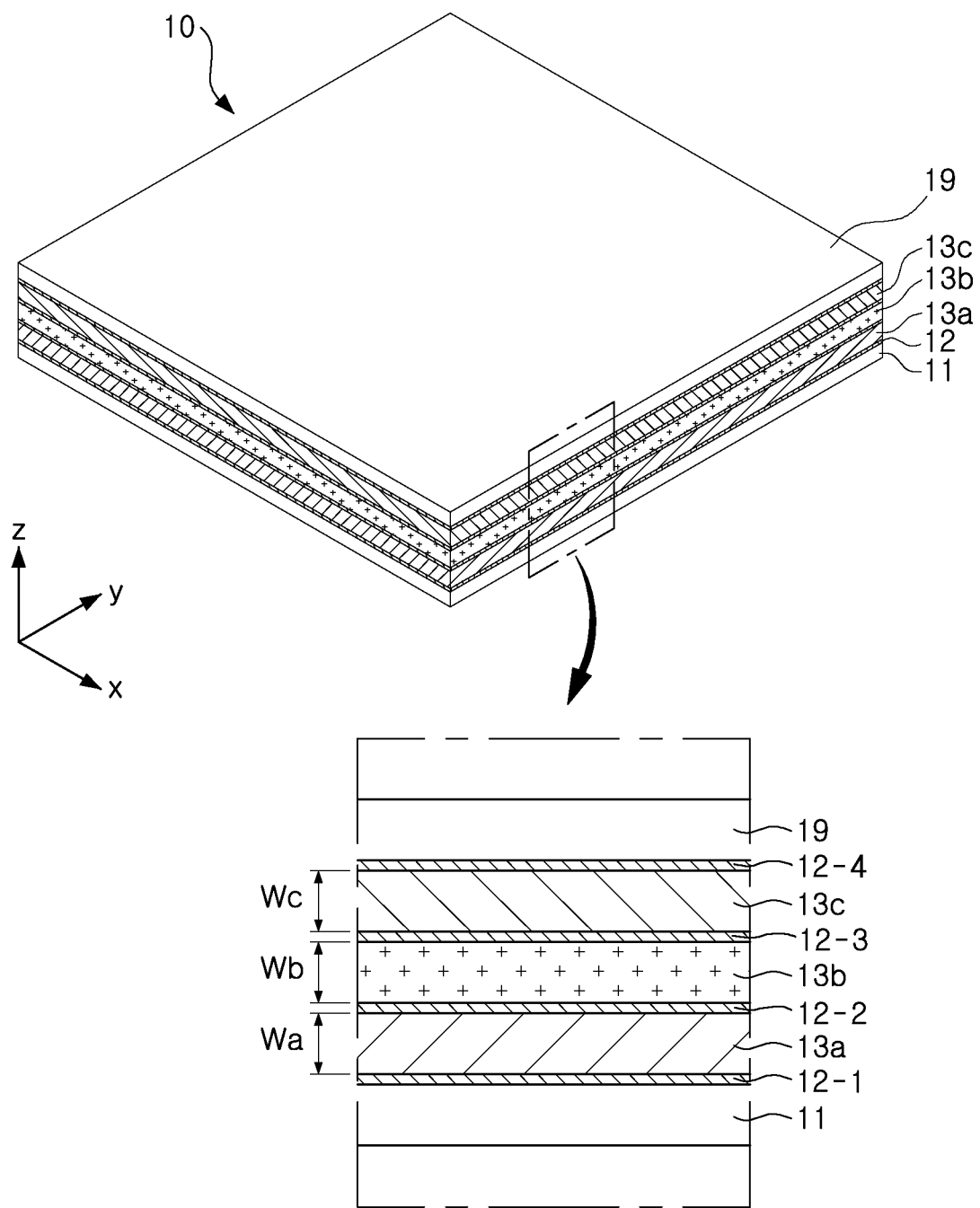
Figure 3:
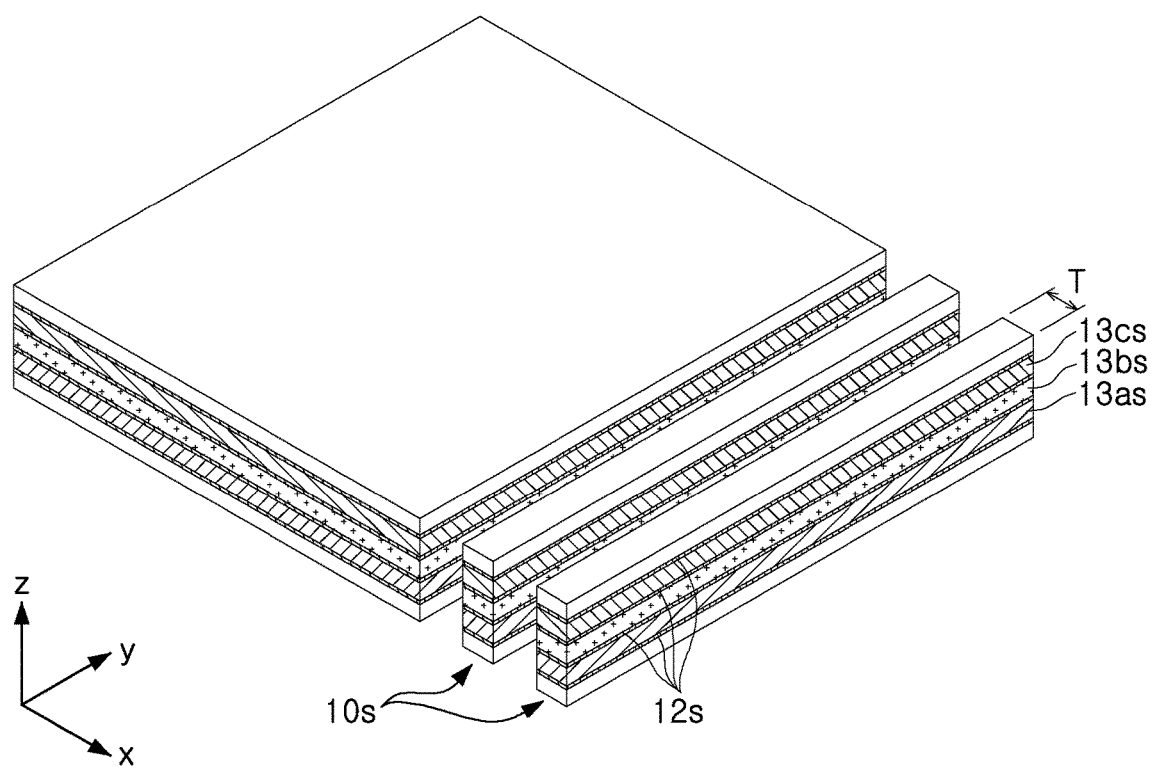

FIGS. 1, 2 and 3 are views illustrating a method of manufacturing a film strip employed in a method of manufacturing a light emitting device package according to example embodiments, respectively.

Referring to FIGS. 1 and 2, a light blocking layer 12-1 may be formed on a base film 11, and a first wavelength conversion layer 13a may be formed on the light blocking layer 12-1. Subsequently, an additional light blocking layer 12-2 may be formed on the first wavelength conversion layer 13a, and a second wavelength conversion layer 13b may be formed on the additional light blocking layer 12-2. As shown in FIG. 2, an additional light blocking layer 12-3 may then be formed on the second wavelength conversion layer 13b, and a third wavelength conversion layer 13c may be formed on the additional light blocking layer 12-3. An uppermost light blocking layer 12-4 may subsequently be formed on the third wavelength conversion layer 13c. A protective film 19 may be formed on the uppermost light blocking layer 12-4. Thus, a multilayer film 10 may be manufactured. The light blocking layers 12 and the first to third wavelength conversion layers 13a to 13c may be formed respectively by applying a resin mixture forming each layer, forming a thick film by spreading the resin mixture to a certain thickness with a blade (B), and hardening the thick film. A method of forming the light blocking layers 12 and the first to third wavelength conversion layers 13a to 13c is not limited to the above description, and a method of manufacturing a thick film including a polymer resin may be used.

The light blocking layers 12 may be formed of a silicon resin mixed with a carbon black or a TiO2 powder. The light blocking layers 12 may be disposed between the first to third wavelength conversion layers 13a to 13c as described above with respect to FIG. 2 to prevent light having various wavelengths emitted from the first to third wavelength conversion layers 13a to 13c from being combined (or mixed). The light blocking layers 12 may reduce optical interference that may occur between the first to third wavelength conversion layers 13a to 13c.

The first to third wavelength conversion layers 13a to 13c may include different wavelength conversion materials. For example, the first wavelength conversion layer 13a may be formed of a silicon resin mixed with red phosphor particles. The second wavelength conversion layer 13b may be formed of a silicon resin mixed with green phosphor particles. The third wavelength conversion layer 13c may be formed of a silicon resin mixed with blue phosphor particles. The silicon resins are only examples, and the present inventive concept is not limited thereto.

Thicknesses Wa, Wb, and Wc of the first to third wavelength conversion layers 13a to 13c (see FIG. 2) may be the same as one another, but the present inventive concept is not limited thereto. In other example embodiments, the thicknesses Wa, Wb, and Wc of the first to third wavelength conversion layers 13a to 13c may be different from one another.

The multilayer film 10 may be cut into a strip having a certain width to be bonded to a light emitting device including three light emitting regions arranged in a single row. In this case, the thickness Wa of the first wavelength conversion layer 13a, the thickness Wb of the second wavelength conversion layer 13b, and the thickness Wc of the third wavelength conversion layer 13c may correspond to widths of the light emitting regions, respectively (Refer to FIG. 15 and associated description below). The thicknesses Wa, Wb, and Wc of the first to third wavelength conversion layers 13a to 13c may be, for example, from about 50 μm to about 200 μm. In a different manner, when the multilayer film 10 is bonded to a light emitting device including a single light emitting region, each of the thickness Wa of the first wavelength conversion layer 13a, the thickness Wb of the second wavelength conversion layer 13b, and the thickness Wc of the third wavelength conversion layer 13c may have a thickness equal to about ⅓ of a width of the light emitting region (Refer to FIG. 17 and associated description below). A thickness of each of the light blocking layers 12 may correspond to a width of each of separation regions between the light emitting regions. The thickness of each of the light blocking layers 12 may be, for example, from about 10 μm to about 30 μm.

Referring to FIG. 3, the multilayer film 10 may be cut into strips having certain widths T so that a plurality of film strips 10s extending in a first direction, for example, a y-axis direction in the example of FIG. 3, may be manufactured. Each of the film strips 10s may include four light blocking regions 12s and three wavelength conversion regions 13as, 13bs, and 13cs. The wavelength conversion regions 13as, 13bs, and 13cs may be disposed between the light blocking regions 12s, respectively.

A cross section of each of the film strips 10s may be a part bonded to a light emitting surface of a light emitting device in a process of manufacturing a light emitting device package. In other words, a surface of the Y-Z plane direction in FIG. 3 may be bonded to the light emitting surface of the light emitting device. In a process of bonding each of the film strips 10s to a light emitting device, the base film 11 and the protective film 19 (see FIG. 2) may be removed.

Each of the film strips 10s pre-manufactured by the abovementioned method may be bonded to a light emitting surface of a light emitting device, so that a partition structure and wavelength conversion layers may be formed on the light emitting device in a shorter period of time.

Figure 4:
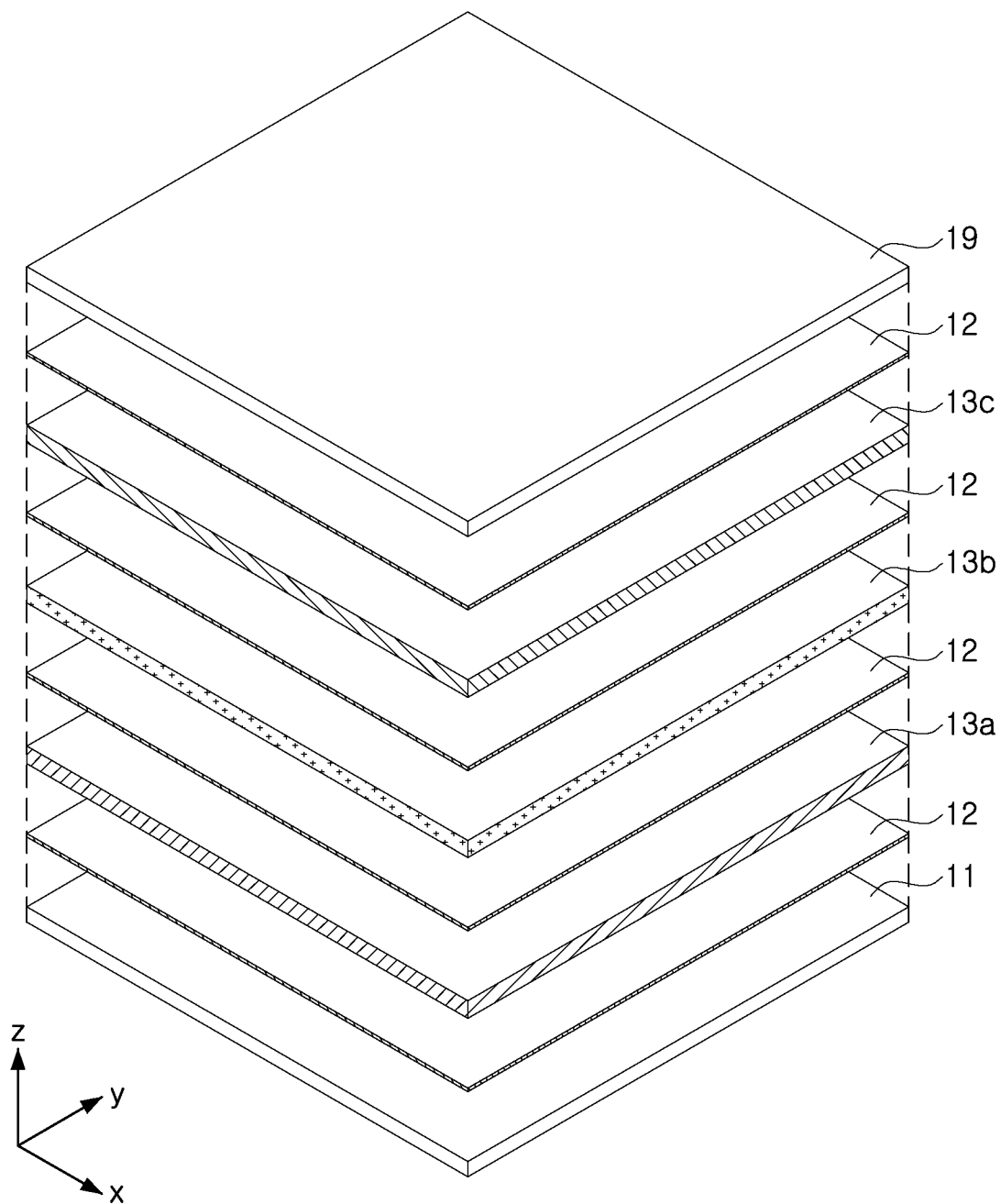
FIG. 4 is a view illustrating a method of manufacturing a film strip employed in a method of manufacturing a light emitting device package according to an example embodiment.

FIG. 4 is a view illustrating a method of manufacturing a multilayer film employed in a method of manufacturing a light emitting device package according to an example embodiment.

Referring to FIG. 4, unlike the example embodiments illustrated with reference to FIGS. 1 through 3, a multilayer film may be manufactured by a process of stacking and bonding light blocking layers 12 and first, second, and third wavelength conversion layers 13a, 13b, and 13c, manufactured in a thick film form through a separate process in the order illustrated in FIG. 4.

The multilayer film manufactured through the process illustrated in FIG. 4 may be cut into a strip having a certain width as illustrated in FIG. 3, so that a film strip 10s including four light blocking regions 12s and three wavelength conversion regions 13as, 13bs, and 13cs disposed between the light blocking regions 12s may be manufactured.

Figure 5:
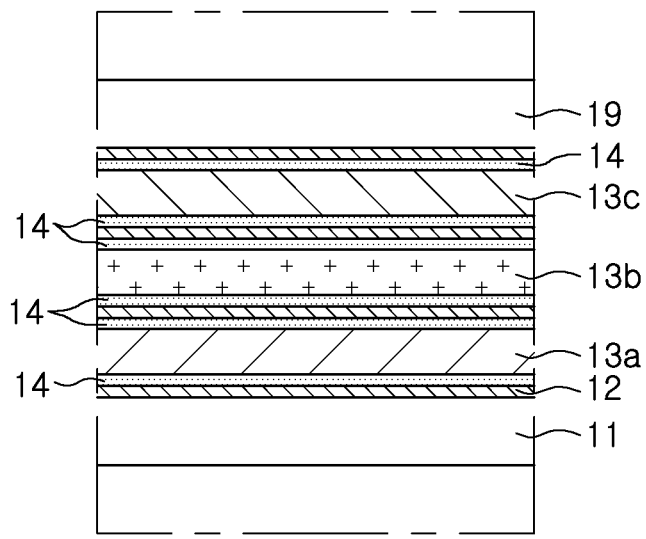
FIGS. 5, 6, 7 and 8 are schematic views illustrating a multilayer film employed in a method of manufacturing a light emitting device package according to example embodiments, respectively.

FIG. 5 is a schematic view illustrating a multilayer film 10A employed in a method of manufacturing a light emitting device package according to an example embodiment. For convenience, only a part of FIG. 5 corresponding to an enlarged view of FIG. 2 is illustrated in FIG. 5.

The multilayer film 10A illustrated in FIG. 5 is a modification of the multilayer film 10 illustrated in FIG. 2. The multilayer film 10A may further have reflectors 14 formed between light blocking layers 12 and wavelength conversion layers 13a, 13b, and 13c as shown in FIG. 5. The reflectors 14 may reflect light emitted from the wavelength conversion layers 13a, 13b, and 13c to thus prevent optical interference that may occur between the wavelength conversion layers 13a, 13b, and 13c. The reflectors 14 may be formed by depositing a reflective metal material such as aluminum (Al) or silver (Ag) on each of the light blocking layers 12 and the wavelength conversion layers 13a, 13b, and 13c in the process of manufacturing the multilayer film 10 illustrated with reference to FIGS. 1 and 2.

The multilayer film 10A may be cut into a strip having a certain width so that a film strip may be manufactured to include four light blocking regions, three wavelength conversion regions disposed between the light blocking regions, and six reflectors disposed between the light blocking regions and the wavelength conversion regions.

Figure 6:
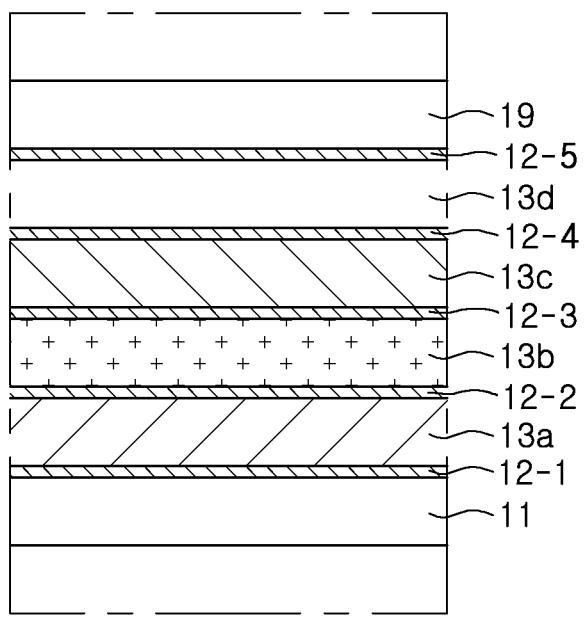

FIG. 6 is a schematic view illustrating a multilayer film 10B employed in a method of manufacturing a light emitting device package according to an example embodiment. For convenience, only a part of FIG. 6 corresponding to the enlarged view of FIG. 2 is illustrated in FIG. 6.

The multilayer film 10B illustrated in FIG. 6 is a modification of the multilayer film 10 illustrated in FIG. 2. The multilayer film 10B may include four wavelength conversion layers 13a-13d. Referring to FIG. 6, a light blocking layer 12-1 may be formed on a base film 11, and a first wavelength conversion layer 13a may be formed on the light blocking layer 12-1. Subsequently, an additional light blocking layer 12-2 may be formed on the first wavelength conversion layer 13a, and a second wavelength conversion layer 13b may be formed on the additional light blocking layer 12-2. An additional light blocking layer 12-3 may then be formed on the second wavelength conversion layer 13b, and a third wavelength conversion layer 13c may be formed on the additional light blocking layer 12-3. An additional light blocking layer 12-4 may then be formed on the third wavelength conversion layer 13c, and a fourth wavelength conversion layer 13d may be formed on the additional light blocking layer 12-4. An uppermost light blocking layer 12-5 may subsequently be formed on the fourth wavelength conversion layer 13d. A protective film 19 may be formed on the uppermost light blocking layer 12-5. A method of forming each layer forming the multilayer film 10B may be the same as the method described above with reference to FIGS. 1 and 2, or FIG. 4.

Thus, the multilayer film 10B may be cut into a strip having a certain width so that a film strip may be manufactured to include five light blocking regions and four wavelength conversion regions disposed between the light blocking regions.

The example embodiment of FIG. 6 is provided to manufacture a film strip bonded to a light emitting device having four light emitting regions arranged in a single row. The first to fourth wavelength conversion layers 13a to 13d may include different wavelength conversion materials. For example, the first wavelength conversion layer 13a may be formed of a silicon resin mixed with red phosphor particles. The second wavelength conversion layer 13b may be formed of a silicon resin mixed with green phosphor particles. The third wavelength conversion layer 13c may be formed of a silicon resin mixed with blue phosphor particles. The fourth wavelength conversion layer 13d may be formed of a silicon resin mixed with phosphor particles to emit white light. The silicon resins are only examples, and the present inventive concept is not limited thereto.

Figure 7:
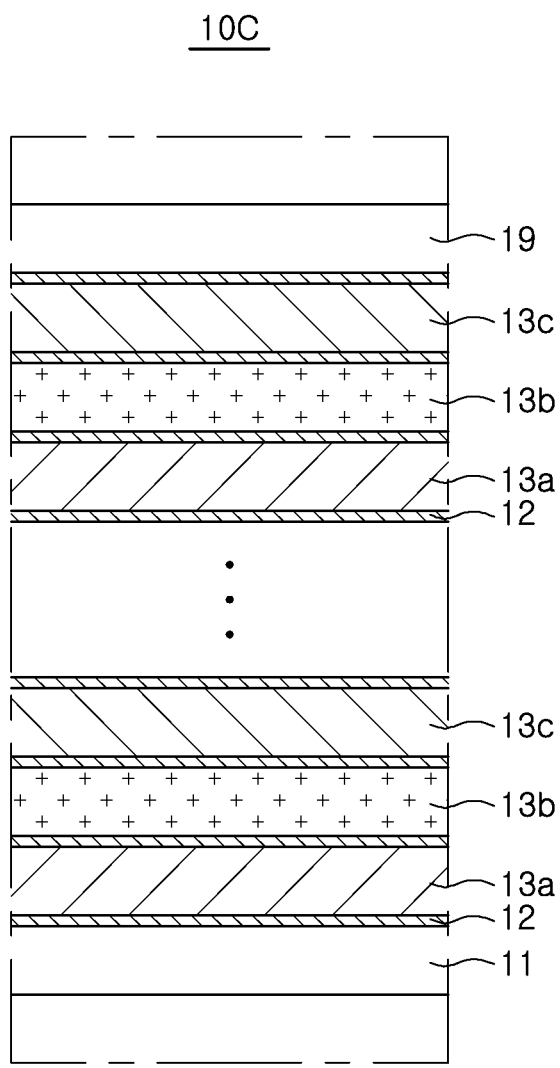

FIG. 7 is a schematic view illustrating a multilayer film 10C employed in a method of manufacturing a light emitting device package according to an example embodiment. For convenience, only a part of FIG. 7 corresponding to the enlarged view of FIG. 2 is illustrated in FIG. 7.

The multilayer film 10C illustrated in FIG. 7 is a modification of the multilayer film 10 illustrated in FIG. 2. The multilayer film 10C may have a structure in which three wavelength conversion layers 13a, 13b, and 13c may be repeatedly stacked. A method of forming each layer forming the multilayer film 10C may be the same as the method described above with reference to FIGS. 1 and 2, or FIG. 4.

The multilayer film 10C may be cut into a strip having a certain width so that a film strip having three wavelength conversion regions repeatedly stacked therein may be manufactured.

According to the example embodiment of FIG. 7, a partition structure and wavelength conversion layers may be simultaneously formed on each of a greater number of light emitting devices, as compared to using the film strip 10s of FIG. 3, to reduce working hours when a partition structure and wavelength conversion layers are formed on each of light emitting devices, thus increasing productivity.

Figure 8:
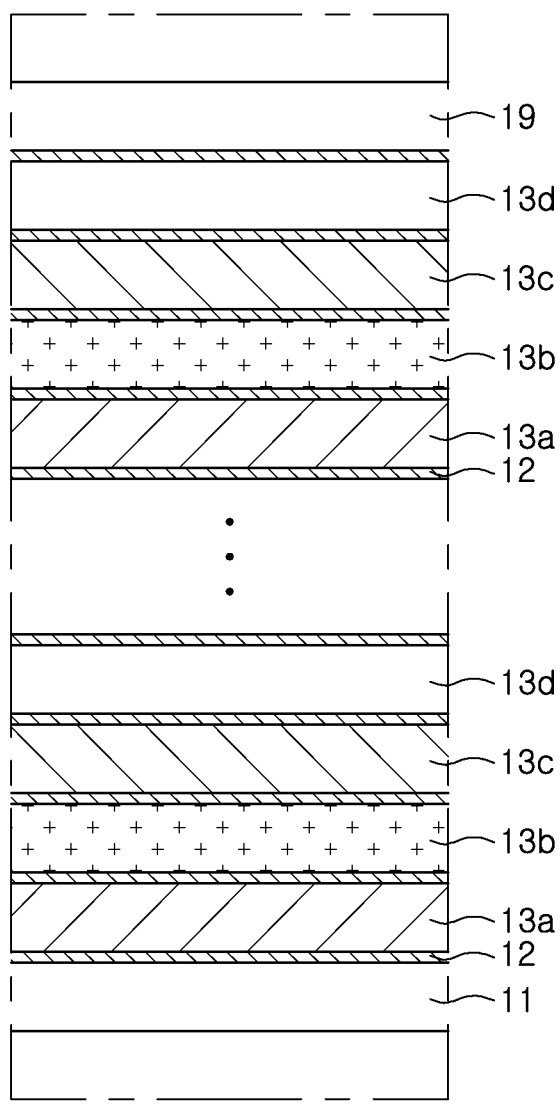

FIG. 8 is a schematic view illustrating a multilayer film 10D employed in a method of manufacturing a light emitting device package according to an example embodiment. For convenience, only a part of FIG. 8 corresponding to the enlarged view of FIG. 2 is illustrated in FIG. 8.

The multilayer film 10D illustrated in FIG. 8 is a modification of the multilayer film 10B illustrated in FIG. 6. The multilayer film 10D may have a structure in which four wavelength conversion layers 13a, 13b, 13c, and 13d may be repeatedly stacked. A method of forming each layer forming the multilayer film 10D may be the same as the method described above with reference to FIGS. 1 and 2 or FIG. 4.

The multilayer film 10D may be cut into a strip having a certain width so that a film strip having four wavelength conversion regions repeatedly stacked therein may be manufactured.

According to the example embodiment of FIG. 8, a partition structure and wavelength conversion layers may be simultaneously formed on each of a greater number of light emitting devices, as compared to using the film strip of FIG. 6, to reduce working hours when a partition structure and wavelength conversion layers are formed on each of light emitting devices, thus increasing productivity.

Figure 9:
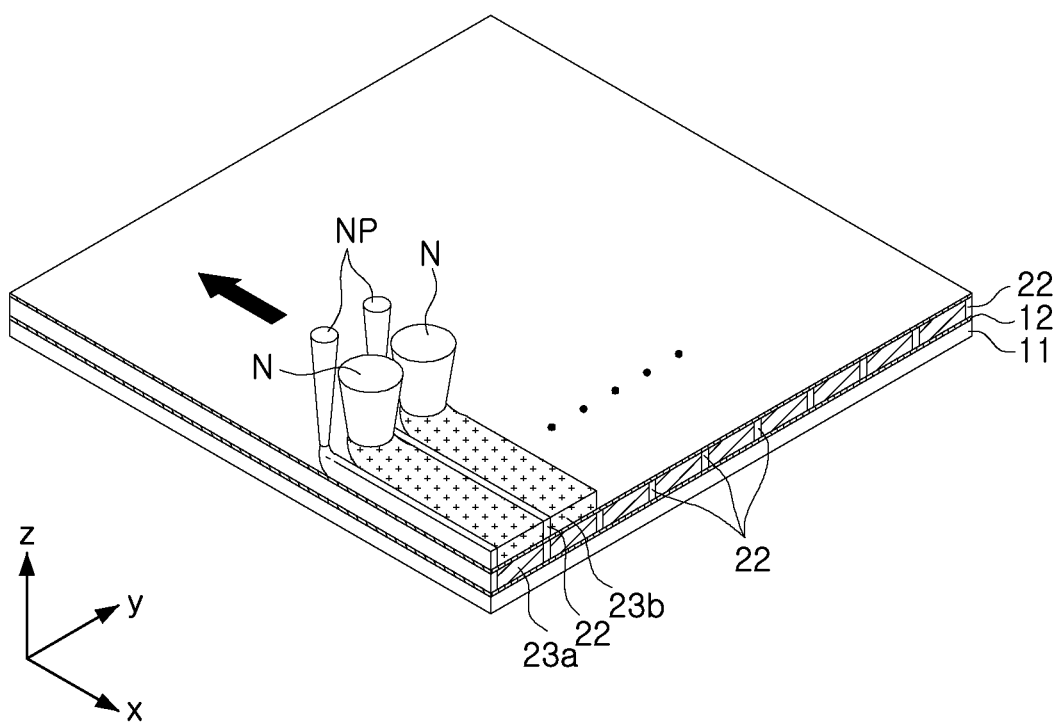
FIGS. 9, 10 and 11 are views illustrating a method of manufacturing a film strip employed in a method of manufacturing a light emitting device package according to example embodiments, respectively.
Figure 10:
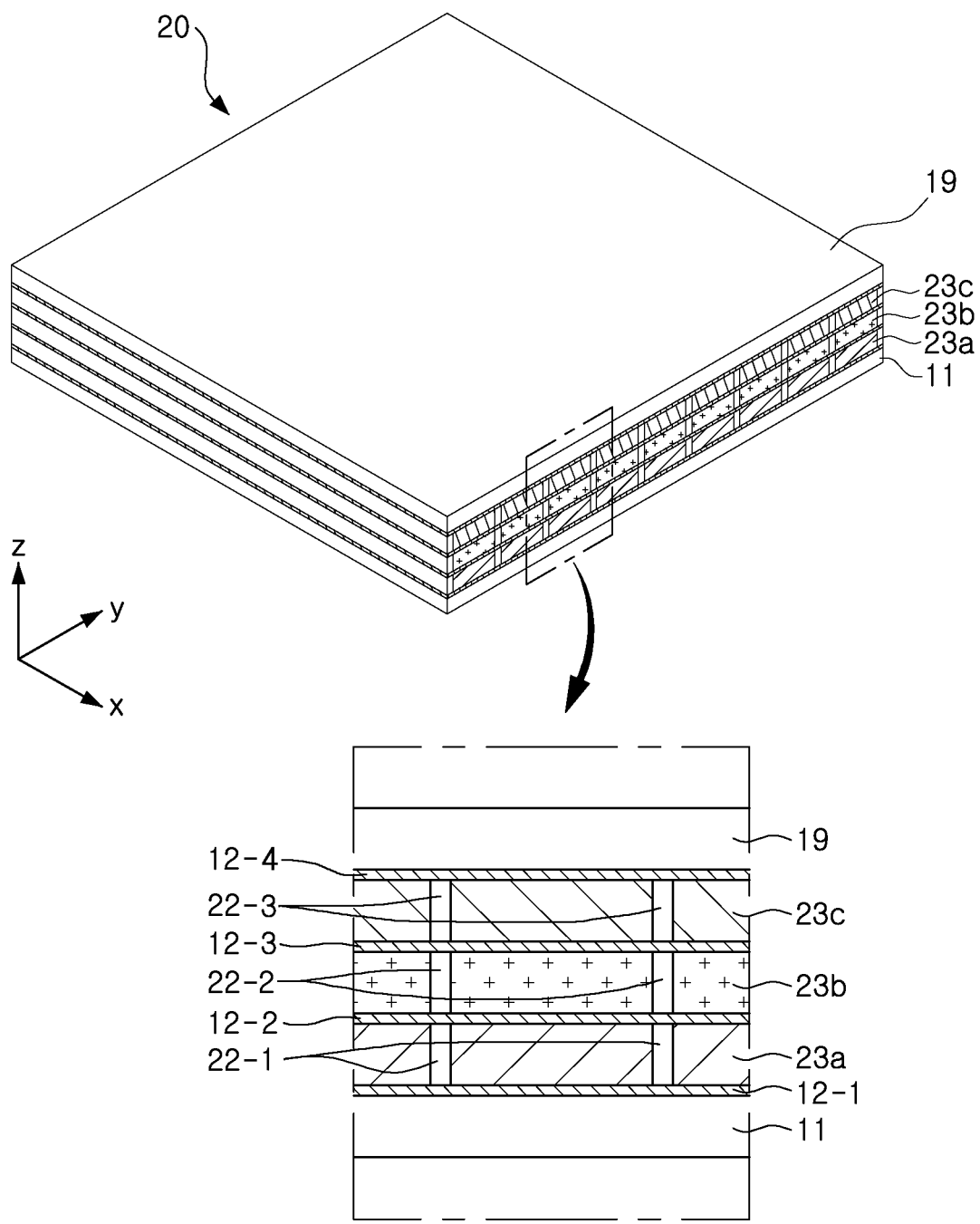
Figure 11:
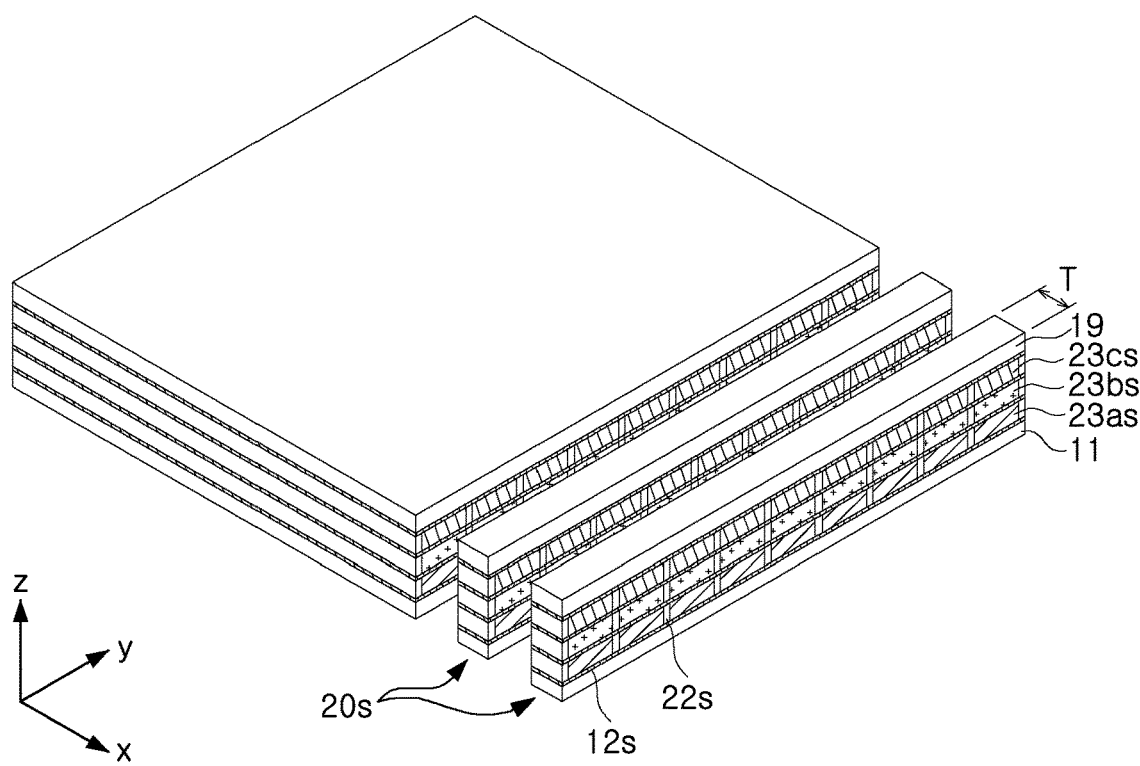

FIGS. 9 through 11 are views illustrating a method of manufacturing a film strip employed in a method of manufacturing a light emitting device package according to example embodiments, respectively.

Referring to FIGS. 9 and 10, a first light blocking layer 12-1 may be formed on a base film 11 in a thick film form, and a stripe pattern having first wavelength conversion layers 23a and second light blocking layers 22-1 extending in a single direction, for example, an x-axis direction in the example shown in FIG. 9, and alternately disposed may be formed on the first light blocking layer 12-1. Each of the first wavelength conversion layers 23a and the second light blocking layers 22-1 may be applied in a line form extending in a single direction through different nozzles N, and NP. The first wavelength conversion layers 23a may have wider widths than those of the second light blocking layers 22-1. The number of each of the nozzles N, and NP shown in FIG. 9 is only an example, and the present inventive concept is not limited thereto. As the number of nozzles increases, a manufacturing time may be reduced.

Sequentially, an additional first light blocking layer 12-2 may be repeatedly formed on the first wavelength conversion layers 23a and the second light blocking layers 22-1 formed as the stripe pattern in a thick film form. A stripe pattern having second wavelength conversion layers 23b and additional second light blocking layers 22-2 alternately disposed therein may be formed on the additional first light blocking layer 12-2.

Sequentially, an additional first light blocking layer 12-3 may be repeatedly formed on the second wavelength conversion layers 23b and the additional second light blocking layers 22-2 formed as the stripe pattern in a thick film form. A stripe pattern having third wavelength conversion layers 23c and additional second light blocking layers 22-3 alternately disposed therein may be formed on the additional first light blocking layer 12-3.

Sequentially, an additional first light blocking layer 12-4 may be repeatedly formed on the third wavelength conversion layers 23c and the additional second light blocking layers 22-3 formed as the stripe pattern in a thick film form. A protective film 19 may be formed on the additional first light blocking layer 12-4 in a thick film form to manufacture a multilayer film 20.

According to the example embodiments of FIGS. 9 and 10, an interval at which the second light blocking layers 22 are disposed may correspond to a size of an individual light emitting device.

Referring to FIG. 11, the multilayer film 20 may be cut into strips having certain widths T so that a plurality of film strips 20s extending in a first direction, for example, a y-axis direction in the example of FIG. 11, may be manufactured. Each of the film strips 20s may include four first light blocking regions 12s, three wavelength conversion regions 23as, 23bs, and 23cs disposed between the first light blocking regions 12s, and second light blocking regions 22s dividing the wavelength conversion regions 23as, 23bs, and 23cs in the y-axis direction at certain intervals as shown in FIG. 11.

A cross section of each of the film strips 20s may be a part bonded to a light emitting surface of a light emitting device in a process of manufacturing a light emitting device package. In a process of bonding each of the film strips 20s to a light emitting device, the base film 11 and the protective film 19 may be removed.

Each of the film strips 20s pre-manufactured by the abovementioned method may be bonded to a light emitting surface of a light emitting device having three light emitting regions arranged in a single row, so that a partition structure and wavelength conversion layers may be formed on the light emitting device in a shorter period of time.

Figure 12:
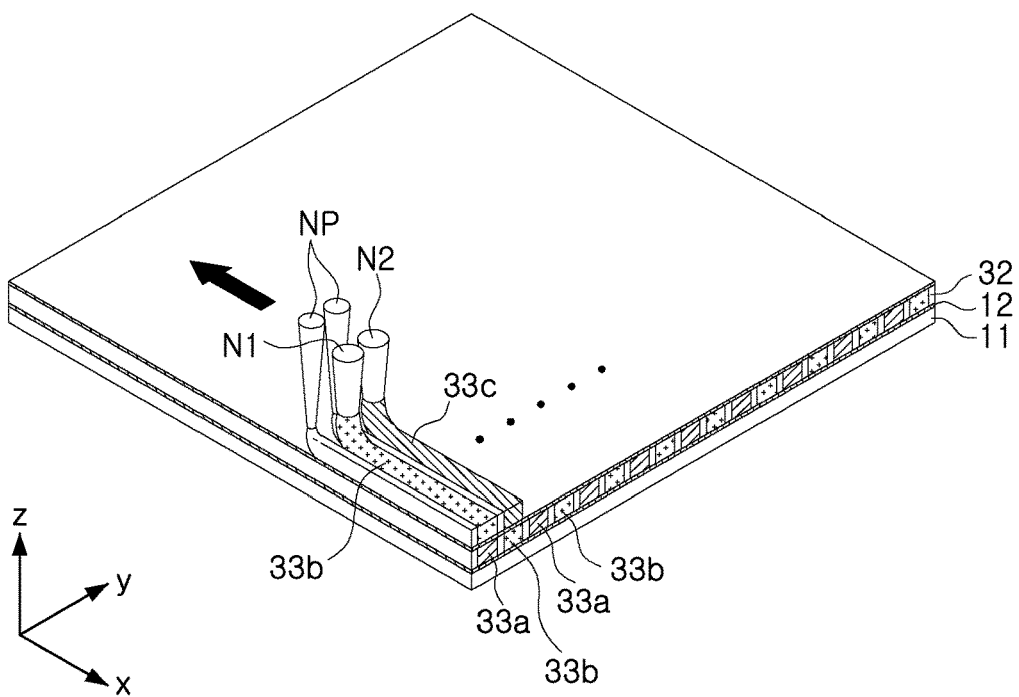
FIGS. 12, 13 and 14 are views illustrating a method of manufacturing a film strip employed in a method of manufacturing a light emitting device package according to example embodiments, respectively.
Figure 13:
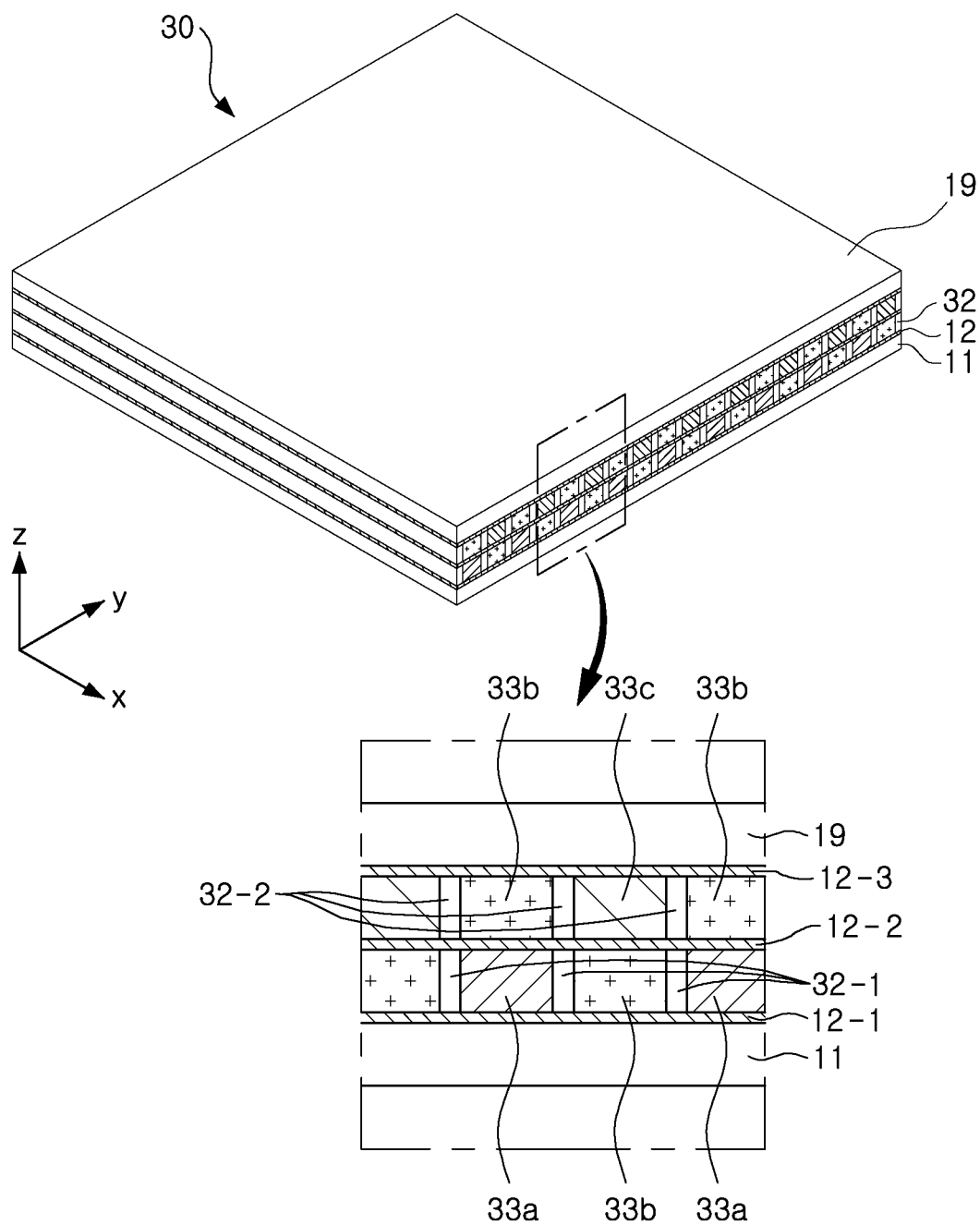
Figure 14:
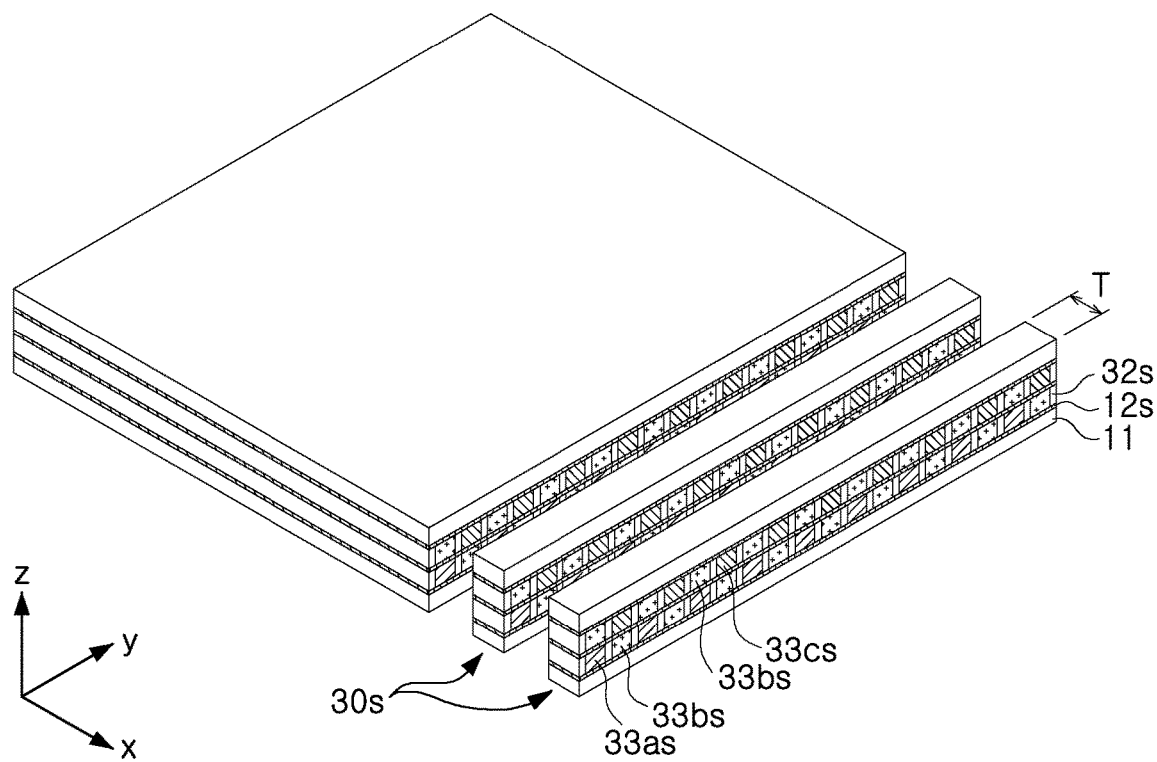

FIGS. 12 through 14 are views illustrating a method of manufacturing a film strip employed in a method of manufacturing a light emitting device package according to example embodiments, respectively.

Unlike the film strip 20s illustrated in FIGS. 9 through 11, the example embodiments of FIGS. 12 through 14 are provided to manufacture a film strip 30s that may be bonded to a light emitting device having four light emitting regions arranged in a 2×2 matrix.

Referring to FIGS. 12 and 13, a first light blocking layer 12-1 may be formed on a base film 11 in a thick film form, and a stripe pattern having second light blocking layers 32-1, first wavelength conversion layers 33a, additional second light blocking layers 32-1, and second wavelength conversion layers 33b, extending in a single direction, for example, an x-axis direction in the example of FIGS. 12-13, and alternately disposed may be formed on the first light blocking layer 12-1. Each of the first wavelength conversion layers 33a, the second wavelength conversion layers 33b, and the second light blocking layers 32-1 may be applied in a line form extending in a single direction through different nozzles N1, N2, and NP (see FIG. 12). The first and second wavelength conversion layers 33a and 33b may have wider widths than those of the second light blocking layers 32-1. The number of each of the nozzles N1, N2, and NP is only an example, and the present inventive concept is not limited thereto. As the number of nozzles increase, a manufacturing time may be reduced.

Sequentially, an additional first light blocking layer 12-2 may be repeatedly formed on the first and second wavelength conversion layers 33a and 33b and the second light blocking layers 32-1 formed as the stripe pattern in a thick film form. A stripe pattern having second light blocking layers 32-2, second wavelength conversion layers 33b, additional second light blocking layers 32-2, and third wavelength conversion layers 33c alternately disposed therein may be formed on the additional first light blocking layer 12-2. In this case, the second wavelength conversion layers 33b may be formed on positions corresponding to those of the first wavelength conversion layers 33a disposed therebelow, and the third wavelength conversion layers 33c may be formed on positions corresponding to those of the second wavelength conversion layers 33b disposed therebelow.

Sequentially, an additional first light blocking layer 12-3 may be repeatedly formed on the second and third wavelength conversion layers 33b and 33c and the second light blocking layers 32-2 formed as the stripe pattern in a thick film form. A protective film 19 may be formed on the additional first light blocking layer 12-3 in a thick film form to manufacture a multilayer film 30.

According to the example embodiments of FIGS. 12 and 13, an interval at which the second light blocking layers 32-1, 32-2 are disposed may correspond to a size of a light emitting region of an individual light emitting device.

Referring to FIG. 14, the multilayer film 30 may be cut into strips having certain widths T so that a plurality of film strips 30s extending in a first direction, for example, a y-axis direction in the example shown in FIG. 14, may be manufactured. Each of the film strips 30s may include three first light blocking regions 12s, second light blocking regions 32s disposed at certain intervals between the first light blocking regions 12s, and wavelength conversion regions 33as, 33bs, and 33cs alternately disposed between the second light blocking regions 32s.

A cross section of each of the film strips 30s may be a part bonded to a light emitting surface of a light emitting device in a process of manufacturing a light emitting device package. In a process of bonding each of the film strips 30s to a light emitting device, the base film 11 and the protective film 19 may be removed.

Each of the film strips 30s pre-manufactured by the abovementioned method may be bonded to a light emitting surface of a light emitting device having four light emitting regions arranged in a 2×2 matrix, so that a partition structure and wavelength conversion layers may be formed on the light emitting device in a shorter period of time.

Figure 15:
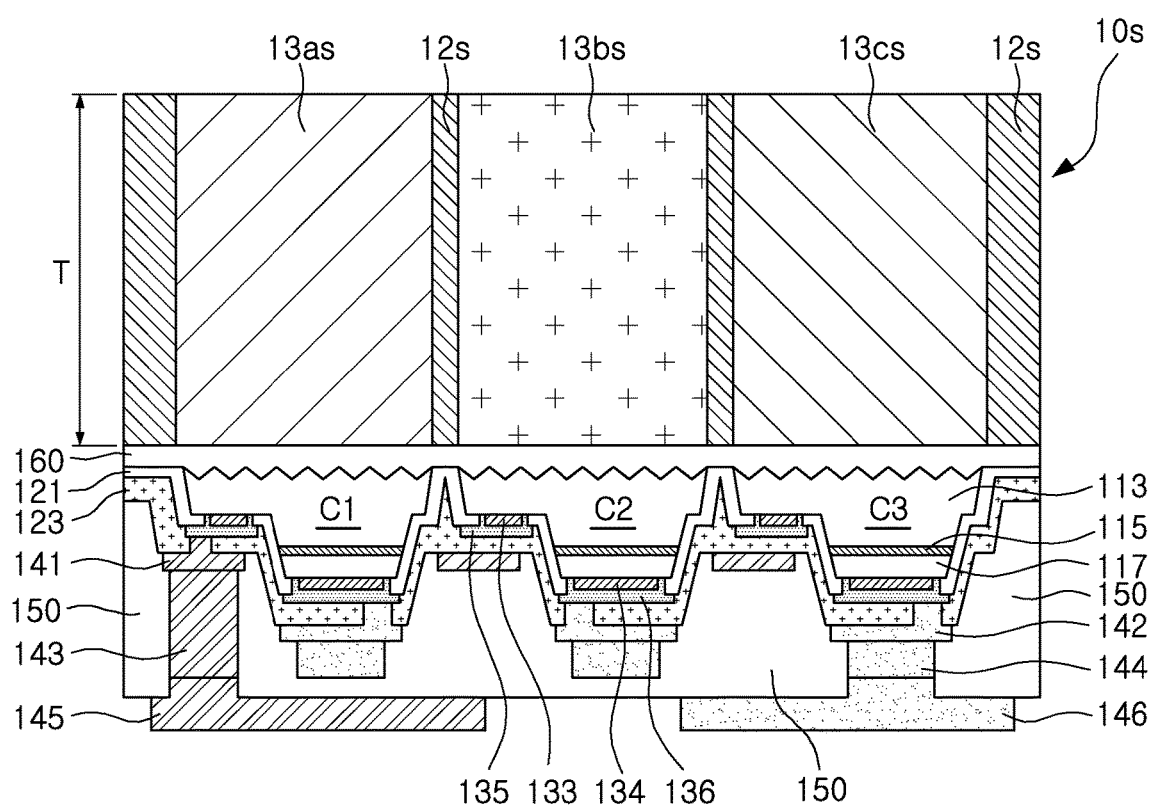
FIG. 15 is a cross-sectional view of a light emitting device package manufactured according to an example embodiment.

FIG. 15 is a cross-sectional view of a light emitting device package manufactured according to an example embodiment.

A light emitting device package 100 illustrated in FIG. 15 may be formed by bonding the film strip 10s illustrated in FIG. 2 to a light emitting surface of a light emitting device having three light emitting regions.

Referring to FIG. 15, the light emitting device package 100 may include three light emitting regions C1, C2, and C3, first and second insulating layers 121 and 123, first contact electrodes 133, a first connection electrode 135, a first plating layer 141, a third plating layer 143, a first electrode pad 145, second contact electrodes 134, second connection electrodes 136, a second plating layer 142, a fourth plating layer 144, a second electrode pad 146, a molding 150, wavelength conversion regions 13as, 13bs, and 13cs, and light blocking regions 12s.

In more detail, the light emitting device package 100 may include a light emitting structure including a first conductive semiconductor layer 113, an active layer 115, and a second conductive semiconductor layer 117. The light emitting structure may be divided into three light emitting regions C1, C2, and C3 by the first insulating layer 121. The light emitting structure may have a first surface provided by the second conductive semiconductor layer 117 and a second surface provided by the first conductive semiconductor layer 113 and provided on an opposite side of the first surface. The second surface of the light emitting structure may be a light emitting surface. The first insulating layer 121 may extend from the first surface to the second surface to divide the light emitting structure into three light emitting regions C1, C2, and C3. A surface of the first insulating layer 121 may be co-planar with the second surface.

The light emitting device package 100 may include three second connection electrodes 136 provided in the respective light emitting regions C1, C2, and C3 and connected to the second conductive semiconductor layer 117, the second contact electrodes 134 disposed between the second conductive semiconductor layer 117 and the second connection electrodes 136, and the second electrode pad 146 connected to the second connection electrodes 136 through the second plating layer 142 and the fourth plating layer 144. Only a single second electrode pad 146 connected to the third light emitting region C3 is illustrated on the drawings, but two second electrode pads 146 connected to the first light emitting region C1 and the second light emitting region C2 may be further provided. For example, the light emitting device package 100 may include three second electrode pads 146 connected to the respective light emitting regions C1, C2, and C3.

The light emitting device package 100 may also include the first connection electrode 135 commonly connected to first conductive semiconductor layers 113 of the light emitting regions C1, C2, and C3, the first contact electrodes 133 disposed between the first conductive semiconductor layers 113 and the first connection electrode 135, and the first electrode pad 145 connected to the first connection electrode 135 through the first plating layer 141 and the third plating layer 143. The first connection electrode 135 may be integrally disposed over three light emitting regions C1, C2, and C3. The first electrode pad 145 and the second electrode pad 146 may be disposed on the first surface of the light emitting structure.

The first conductive semiconductor layer 113 may be an n-type semiconductor layer. The second conductive semiconductor layer 117 may be a p-type semiconductor layer. The first electrode pad 145 may be a common cathode connected to the n-type semiconductor layers of the light emitting regions C1 to C3. For example, the light emitting device package 100 may include three anodes and a single common cathode connected to the n-type semiconductor layers of the respective light emitting regions C1 to C3. Conversely, according to an example embodiment, the first conductive semiconductor layer 113 may be a p-type semiconductor layer. The second conductive semiconductor layer 117 may be an n-type semiconductor layer. The first electrode pad 145 may be a common anode connected to the p-type semiconductor layers of the light emitting regions C1, C2, and C3. For example, the light emitting device package 100 may include three cathodes and a single common anode connected to the p-type semiconductor layers of the respective light emitting regions C1, C2, and C3.

The light emitting device package 100 may include the molding 150 provided below the light emitting regions C1, C2, and C3 and surrounding the third and fourth plating layers 143 and 144. The light emitting device package 100 may include the wavelength conversion regions 13as, 13bs, and 13cs provided on the light emitting regions C1, C2, and C3 to convert a wavelength of light emitted from each of the light emitting regions C1, C2, and C3, and the light blocking regions 12s disposed on both sides of each of the wavelength conversion regions 13as, 13bs, and 13cs. The light blocking regions 12s may correspond to portions of the first insulating layer 121 positioned between the light emitting regions C1, C2, and C3. The wavelength conversion regions 13as, 13bs, and 13cs may correspond to the light emitting regions C1, C2, and C3, respectively.

The wavelength conversion regions 13as, 13bs, and 13cs and the light blocking regions 12s may be formed by bonding the film strip 10s having a certain width T illustrated in FIG. 3 or FIG. 11 to the light emitting regions C1, C2, and C3 and cutting the film strip 10s into individual light emitting device units. Widths of the wavelength conversion regions 13as, 13bs, and 13cs may be the same as those of the light emitting regions C1 to C3.

A bonding layer 160 may be formed to bond the film strip 10s. The bonding layer 160 may be formed of a silicon resin having a thickness of about 10 μm.

For example, when the light emitting regions C1, C2, and C3 emit ultraviolet (UV) light, a first wavelength conversion region 13as may include a red phosphor, a second wavelength conversion region 13bs may include a green phosphor, and a third wavelength conversion region 13cs may include a blue phosphor.

In a different manner, according to an example embodiment, when the light emitting regions C1, C2, and C3 emit blue light, the first wavelength conversion region 13as may include a red phosphor, the second wavelength conversion region 13bs may include a green phosphor, and the third wavelength conversion region 13cs may include a green phosphor having a concentration lower than that of the green phosphor included in the second wavelength conversion region 13bs. The green phosphor included in the third wavelength conversion region 13cs may contribute to adjusting CIE color coordinates of a light emitting device.

Figure 16A:
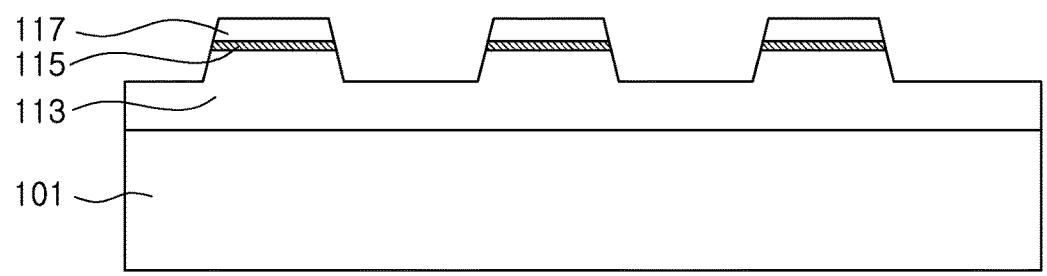
FIGS. 16A through 16N are cross-sectional views illustrating a method of manufacturing a light emitting device package according to an example embodiment.
Figure 16B:
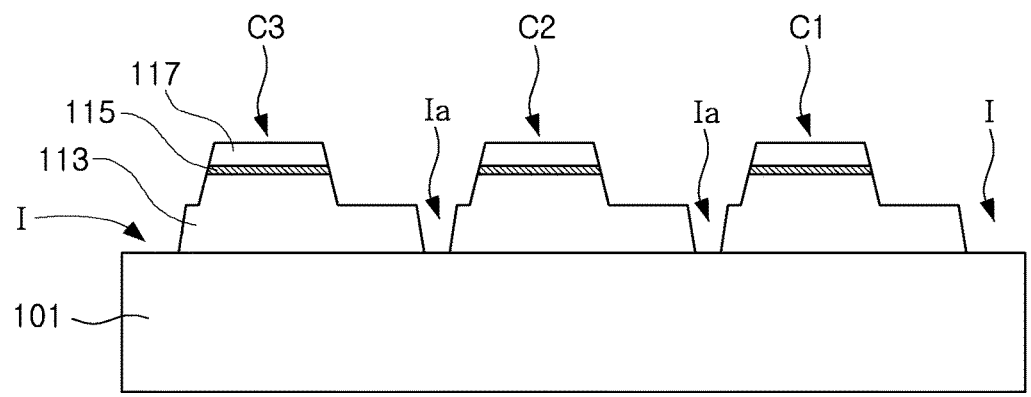
Figure 16C:
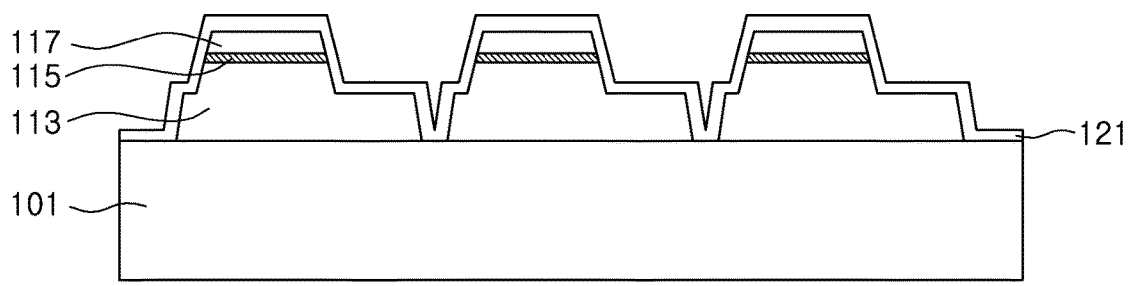
Figure 16D:
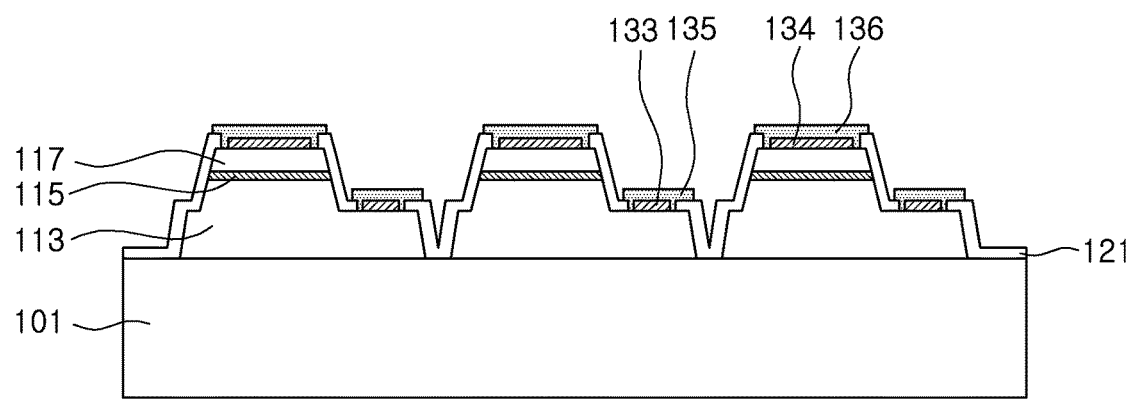
Figure 16E:
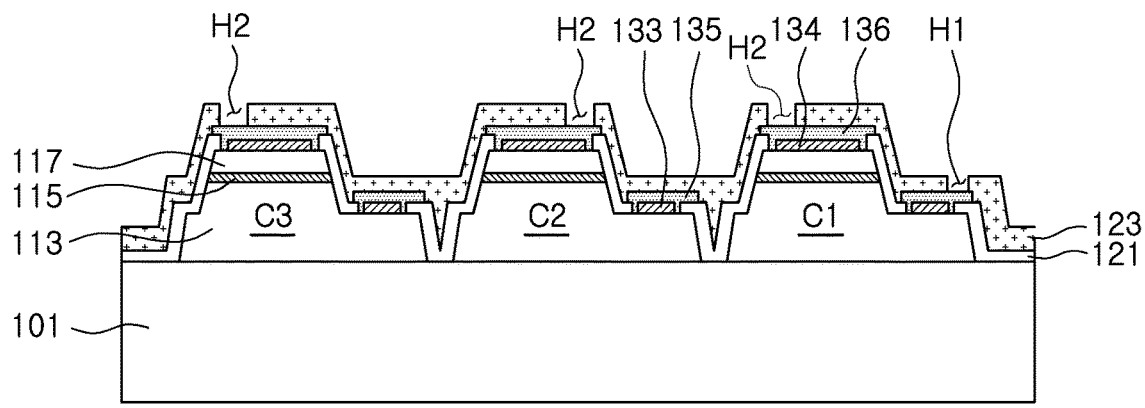
Figure 16F:
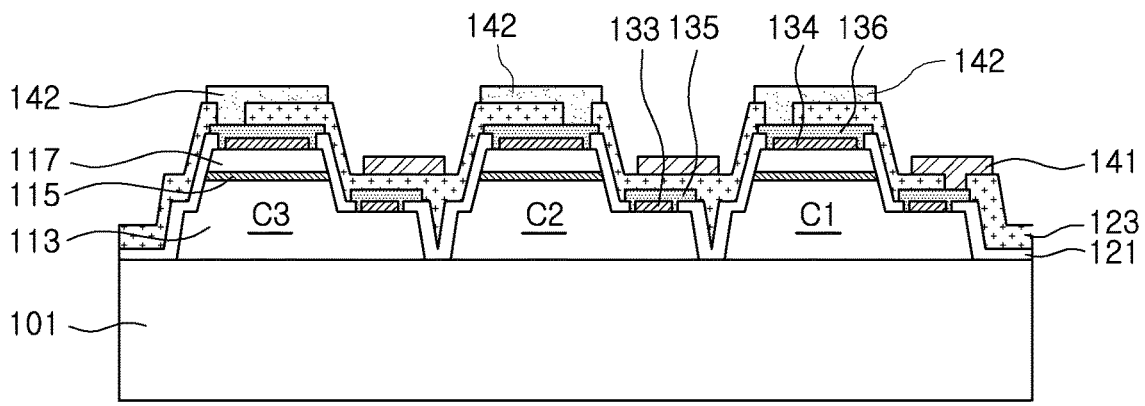
Figure 16G:
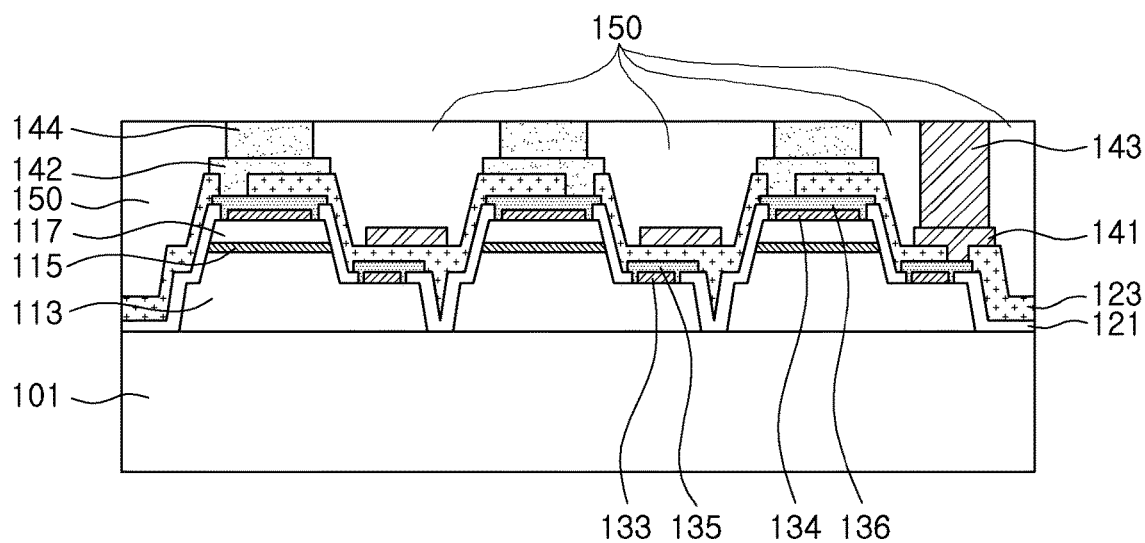
Figure 16H:
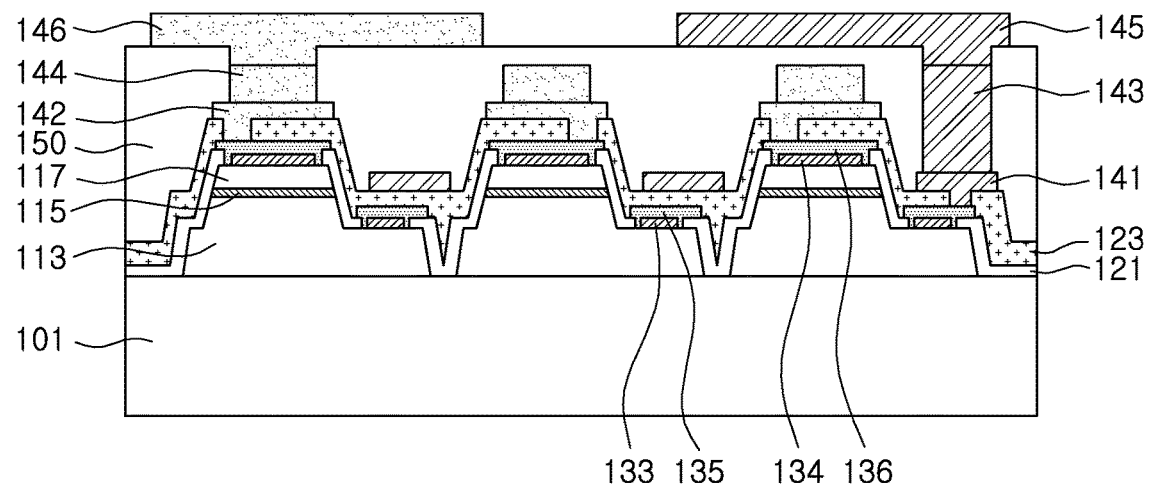
Figure 16I:
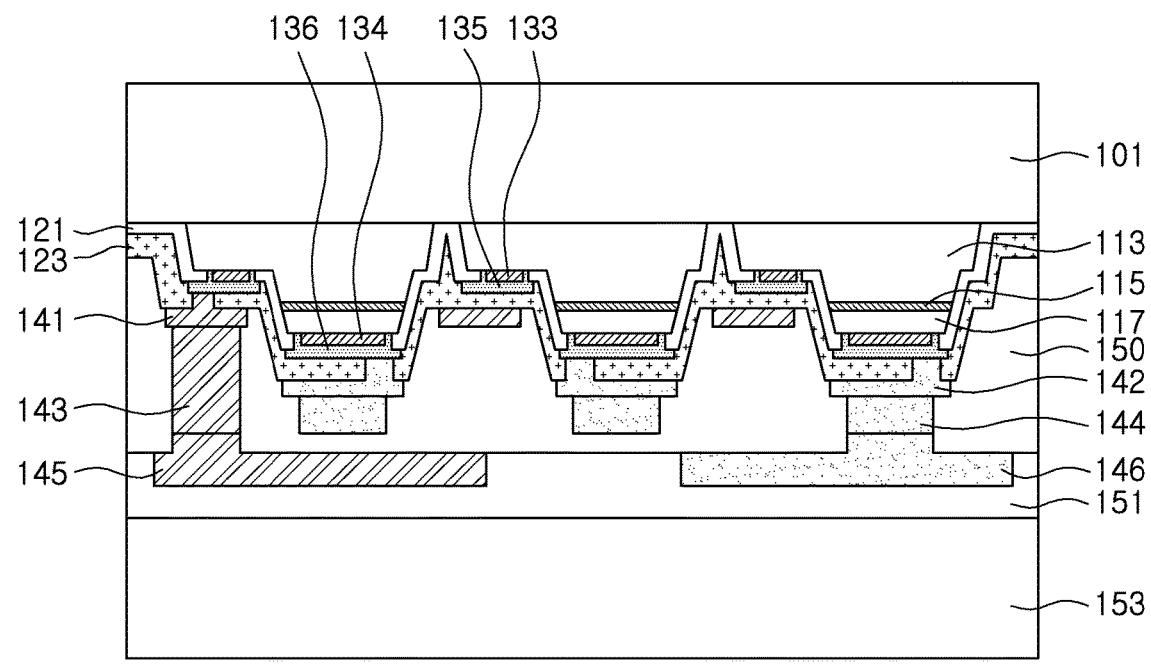
Figure 16J:
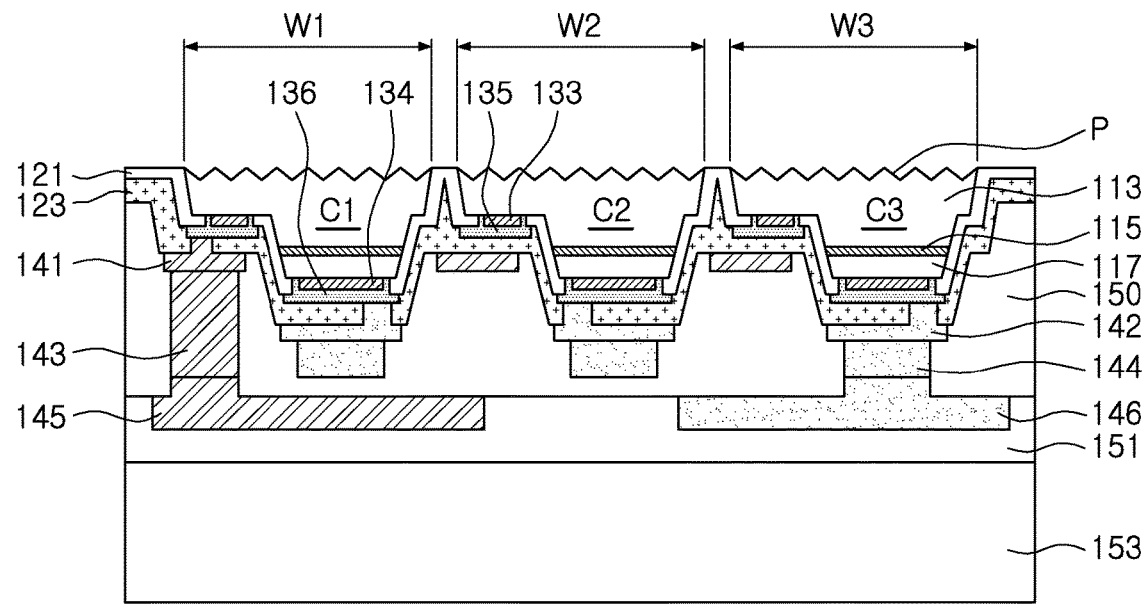
Figure 16K:
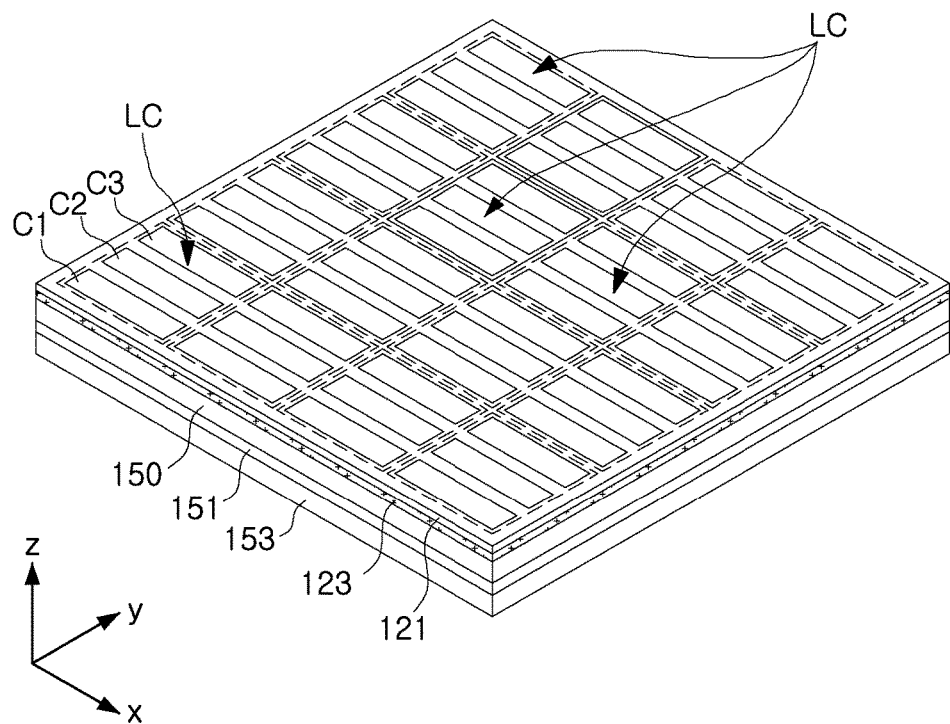
Figure 16L:
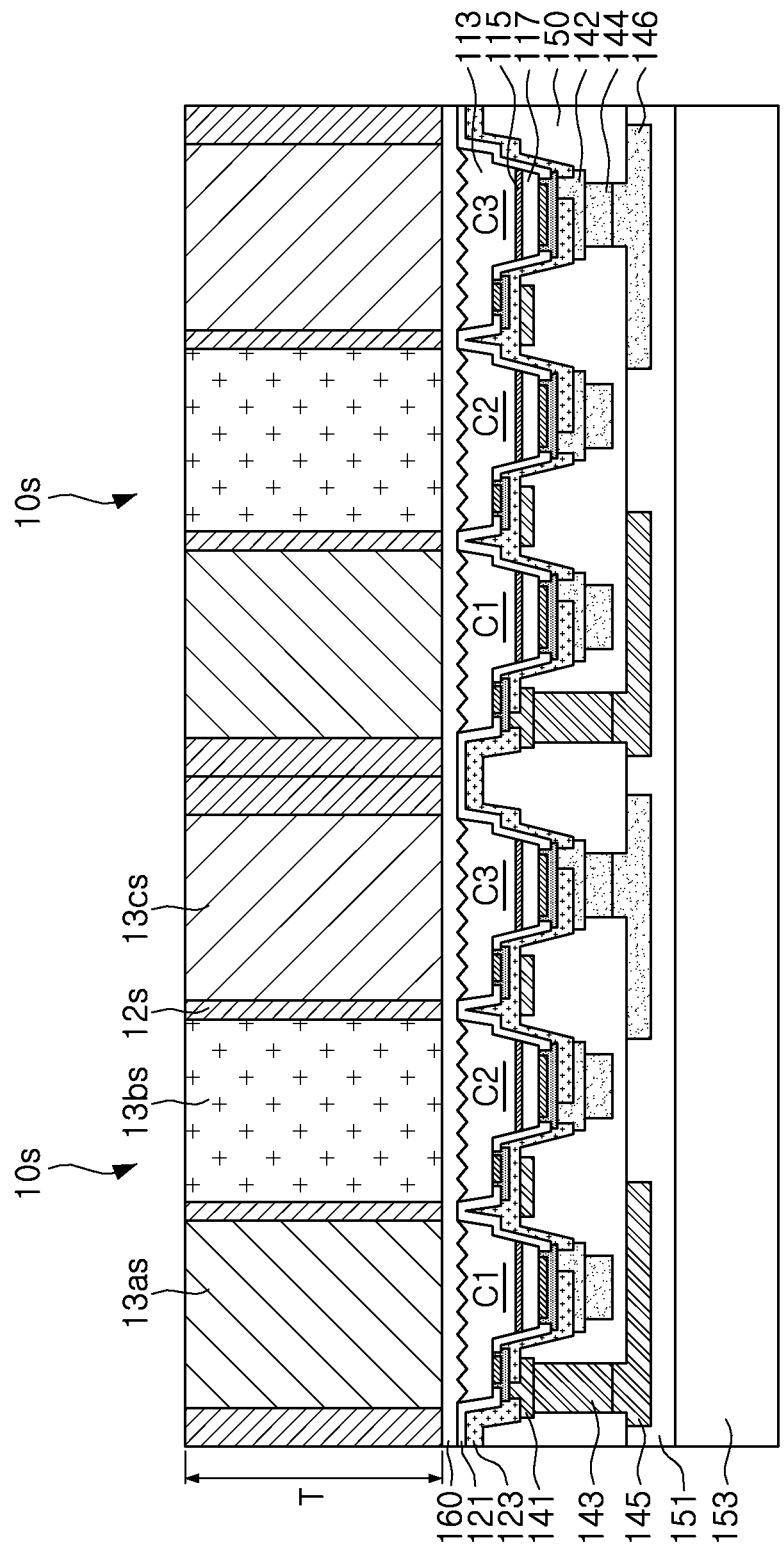
Figure 16M:
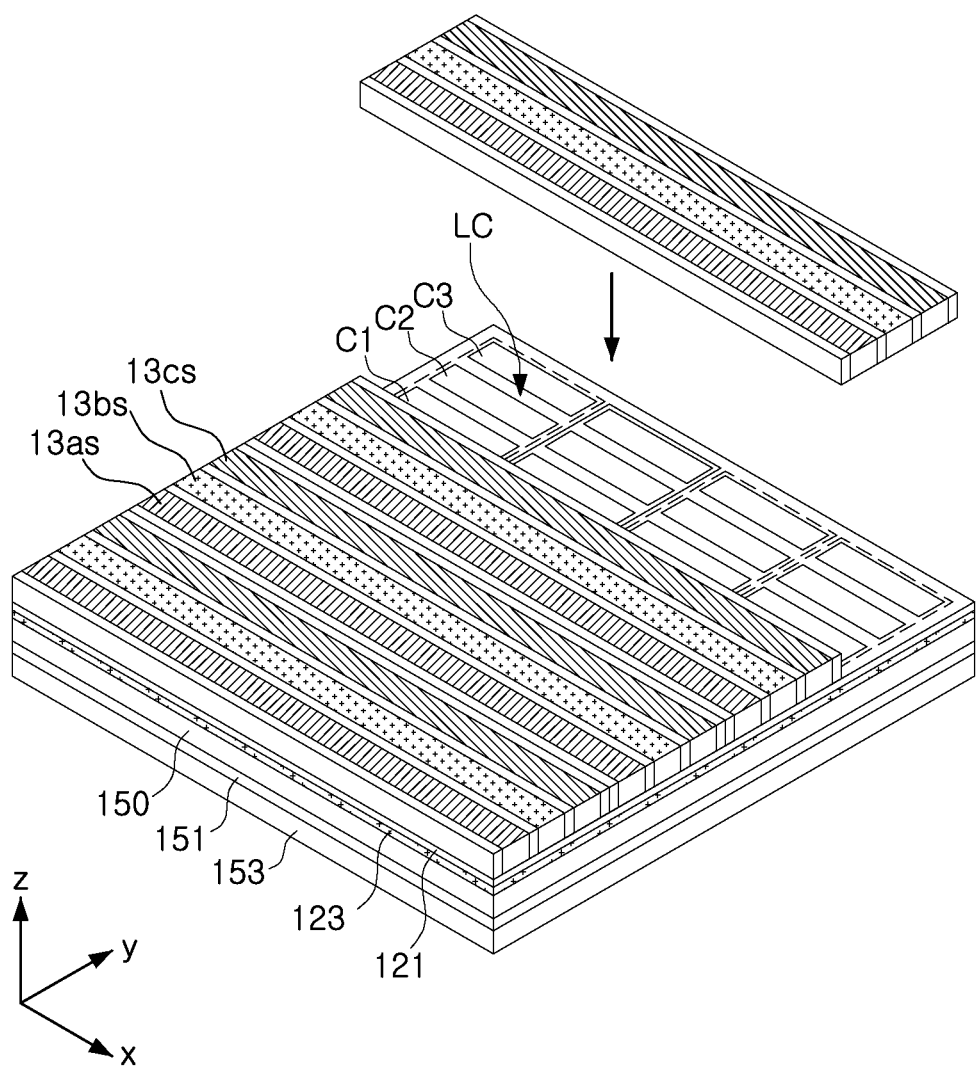
Figure 16N:
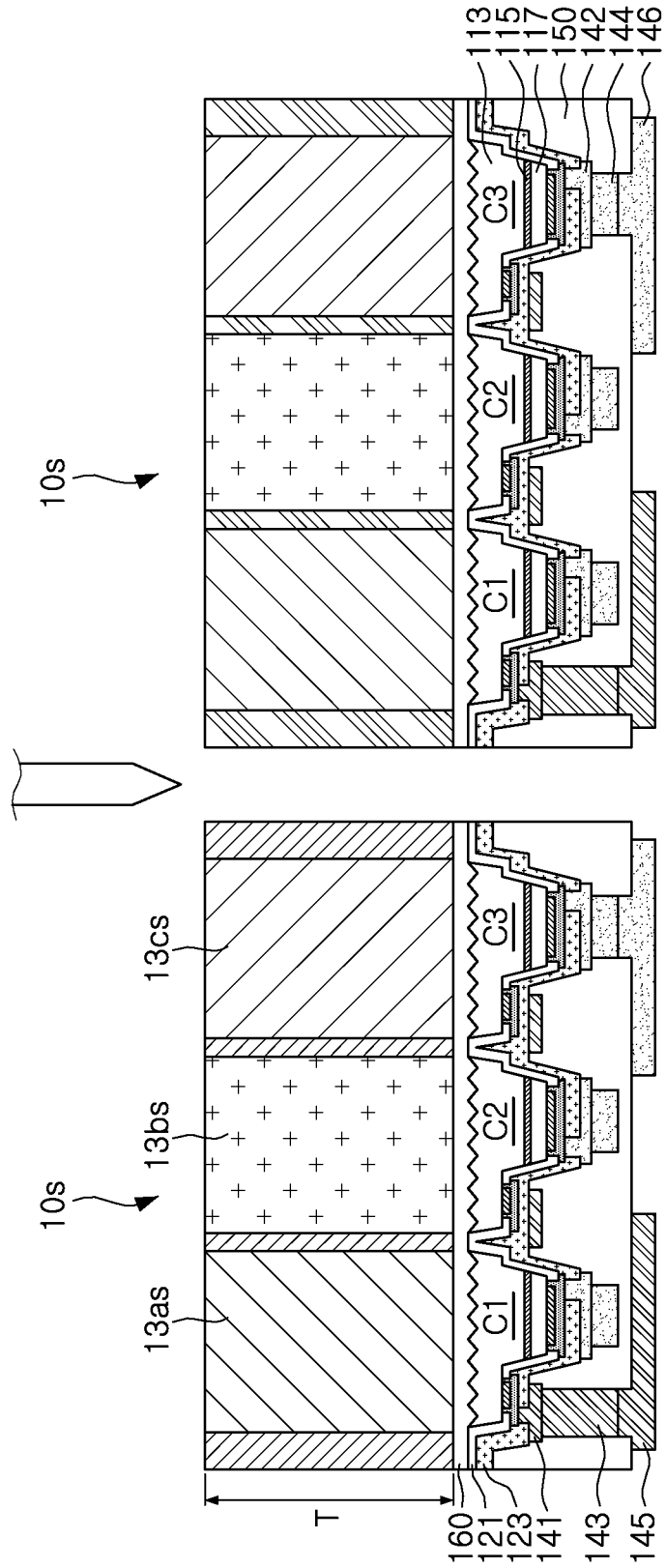

FIGS. 16A through 16N are cross-sectional views illustrating a method of manufacturing a light emitting device package according to an example embodiment, respectively. In more detail, the method of manufacturing a light emitting device package relates to a method of manufacturing a wafer-level chip scale package. For convenience, some of the drawings illustrate a single light emitting device package.

Referring to FIG. 16A, the method of manufacturing a light emitting device package may start from forming a light emitting structure in which a first conductive semiconductor layer 113, an active layer 115, and a second conductive semiconductor layer 117 may be stacked on a substrate 101.

The substrate 101 may be an insulating, conductive, or semiconductor substrate, if necessary. The substrate 101 may be a sapphire, SiC, silicon (Si), $MgAl_2O_4$, MgO, $LiAlO_2$, $LiGaO_2$, or GaN substrate. According to the example embodiment of FIG. 16A, the substrate 101 may be a Si substrate.

The first conductive semiconductor layer 113 may be a nitride semiconductor layer satisfying n-type $In_xAl_yGa_{1-x-y}N$ ($0 \leq x < 1$, $0 \leq y < 1$, $0 \leq x+y < 1$), and an n-type impurity may be silicon (Si), germanium (Ge), selenium (Se), tellurium (Te), or the like. The active layer 115 may have a multiple quantum well (MQW) structure in which quantum well layers and quantum barrier layers are alternately stacked on each other. For example, the quantum well layers and the quantum barrier layers may be $In_xAl_yGa_{1-x-y}N$ ($0 \leq x \leq 1$, $0 \leq y \leq 1$, $0 \leq x+y \leq 1$) having different compositions. As a certain example, the quantum well layers may be $In_xGa_{1-x}N$ ($0 < x \leq 1$), and the quantum barrier layers may be GaN or AlGaN. The second conductive semiconductor layer 117 may be a nitride semiconductor layer satisfying p-type $In_xAl_yGa_{1-x-y}N$ ($0 \leq x < 1$, $0 \leq y < 1$, $0 \leq x+y < 1$), and a p-type impurity may be magnesium (Mg), zinc (Zn), beryllium (Be), or the like.

The substrate 101 and the first conductive semiconductor layer 113 may have a buffer layer provided therebetween. The buffer layer may be $In_xAl_yGa_{1-x-y}N$ ($0 \leq x \leq 1$, $0 \leq y \leq 1$). For example, the buffer layer may be AlN, AlGaN, or InGaN. In some example embodiments, the buffer layer may be formed by combining a plurality of layers having different compositions, or may be formed of a single layer whose composition is gradually changed.

Sequentially, a mesa structure may be formed by etching portions of the second conductive semiconductor layer 117 and the active layer 115, so that portions of the first conductive semiconductor layer 113 may be exposed.

Referring to FIG. 16B, an isolation process for dividing the light emitting structure into a plurality of light emitting regions may be performed. By etching portions of the exposed portions of the first conductive semiconductor layer 113, a separation region I and a sub-separation region Ia exposing portions of the substrate 101 may be formed. The isolation process may allow the light emitting structure to be divided into a plurality of light emitting regions C1, C2, and C3. The separation region I may be formed every three light emitting regions C1, C2, and C3. The sub-separation regions Ia may be formed between the three light emitting regions C1, C2, and C3, as shown in FIG. 16B. According to the example embodiment of FIG. 16B, the three light emitting regions C1, C2, and C3 may be included in a single light emitting device package. Each of the light emitting regions C1, C2, and C3 may have inclined lateral surfaces with respect to an upper surface of the substrate 101. The isolation process may allow the light emitting structure to be divided into a plurality of light emitting structures, and may allow the light emitting structures to be arranged at regular intervals in rows and columns, so that a light emitting structure array may be formed.

Referring to FIG. 16C, a first insulating layer 121 covering the light emitting regions C1, C2, and C3 may be formed.

The first insulating layer 121 may be formed in the separation region I and the sub-separation regions Ia to electrically insulate the light emitting regions C1, C2, and C3 from each other. The first insulating layer 121 may be formed of any material having electrically insulating properties, as well as a material having low light absorption properties. The first insulating layer 121 may be formed of, for example, a silicon oxide, a silicon oxynitride, or a silicon nitride. In a different manner, according to an example embodiment, the first insulating layer 121 may have a multilayer reflective structure in which a plurality of insulator films having different refractive indexes are alternately stacked. For example, the multilayer reflective structure may be a distributed Bragg reflector (DBR) in which first insulator films having a first refractive index and second insulator films having a second refractive index are alternately stacked. The multilayer reflective structure may have the plurality of first and second insulator films having different refractive indexes and repeatedly stacked from 2 to 100 times. Each of the first and second insulator films forming the multilayer reflective structure may be formed of $SiO_2$, SiN, $SiO_xN_y$, $TiO_2$, $Si_3N_4$, $Al_2O_3$, $ZrO_2$, TiN, AlN, TiAlN, or TiSiN.

Referring to FIG. 16D, portions of the first insulating layer 121 may be removed, and first contact electrodes 133 and second contact electrodes 134 formed of conductive materials may then be formed.

The portions of the first insulating layer 121 formed on the first conductive semiconductor layer 113 may be removed, and the first contact electrodes 133 may be formed to be electrically connected to the second conductive semiconductor layer 117. The portions of the first insulating layer 121 formed on the second conductive semiconductor layer 117 may be removed, and the second contact electrodes 134 may be formed to be electrically connected to the second conductive semiconductor layer 117.

Each of the first and second contact electrodes 133 and 134 may be a reflective electrode including at least one of silver (Ag), aluminum (Al), nickel (Ni), chromium (Cr), copper (Cu), gold (Au), palladium (Pd), platinum (Pt), tin (Sn), tungsten (W), rhodium (Rh), iridium (Ir), ruthenium (Ru), magnesium (Mg), and zinc (Zn), or alloys thereof.

Sequentially, a first connection electrode 135 covering the first contact electrodes 133 and second connection electrodes 136 covering the second contact electrodes 134 may be formed. The first connection electrode 135 may be integrally formed over the three light emitting regions C1, C2, and C3, and the second connection electrodes 136 may be formed in the light emitting regions C1, C2, and C3, respectively.

Referring to FIG. 16E, a second insulating layer 123 covering the first insulating layer 121, the first connection electrode 135 and the second connection electrodes 136 may be formed. The second insulating layer 123 may have electrically insulating properties, and may be formed using a material having low light absorption properties. The second insulating layer 123 may be formed using the same or a similar material to that of the first insulating layer 121.

Subsequently, portions of the second insulating layer 123 may be removed, and a first opening H1 and second openings H2 may be formed. The first opening H1 may expose a portion of the first connection electrode 135, and the second openings H2 may expose portions of the second connection electrodes 136. The first opening H1 may only expose the portion of the first connection electrode 135 in the light emitting region C1, and the second openings H2 may expose the portions of the second connection electrodes 136 in the respective light emitting regions C1, C2, and C3.

Referring to FIG. 16F, a first plating layer 141 connected to the first connection electrode 135 through the first opening H1 and a second plating layer 142 connected to the second connection electrodes 136 through the second openings H2 may be formed. The first and second plating layers 141 and 142 may be formed by a plating process. The first and second plating layers 141 and 142 may be formed of copper (Cu), and may be formed of a conductive material, other than copper (Cu), but the present inventive concept is not limited thereto.

Referring to FIG. 16G, a third plating layer 143 connected to the first plating layer 141 and a fourth plating layer 144 connected to the second plating layer 142 may be formed. The third and fourth plating layers 143 and 144 may be formed by a plating process. The third and fourth plating layers 143 and 144 may be formed of copper (Cu), and may be formed of a conductive material, other than copper (Cu), but the present inventive concept is not limited thereto.

Subsequently, a space between the light emitting regions C1, C2, and C3 may be filled to form a molding 150 surrounding the third and fourth plating layers 143 and 144. The molding 150 may be formed by a process of applying a molding material to cover upper portions of the third and fourth plating layers 143 and 144, and the performing a flattening process such as grinding. In this process, distal ends of the third and fourth plating layers 143 and 144 may be exposed through a surface of the molding 150. Since the molding 150 is formed to support the light emitting regions C1, C2, and C3, the molding 150 may have a high Young's modulus, and may be formed using a material having high thermal conductivity to emit heat generated by the light emitting regions C1, C2, and C3. The molding 150 may be, for example, an epoxy resin or a silicone resin. The molding 150 may also contain light-reflective particles reflecting light. The light-reflective particles may be formed using a titanium dioxide ($TiO_2$) and/or an aluminum oxide ($Al_2O_3$), but the present inventive concept is not limited thereto.

Referring to FIG. 16H, a first electrode pad 145 connected to the third plating layer 143 and a second electrode pad 146 connected to the fourth plating layer 144 may be formed. The first and second electrode pads 145 and 146 may be formed by a plating process. The first and second electrode pads 145 and 146 may be formed of copper (Cu), and may be formed of a conductive material other than copper (Cu), but the present inventive concept is not limited thereto. In this case, an additional molding 150 may be formed so that the first electrode pad 145 and the fourth plating layer 144 may not contact each other.

FIG. 16H illustrates a single first electrode pad 145 and a single second electrode pad 146, but in some example embodiments, a single first electrode pad 145 commonly connected to the three light emitting regions C1, C2, and C3 and three second electrode pads 146 respectively connected to the three light emitting regions C1, C2, and C3 may be formed. Such a pad configuration may allow the three light emitting regions C1, C2, and C3 to be individually operated.

Referring to FIG. 16I, a support substrate 153 may be bonded to the first and second electrode pads 145 and 146. A bonding layer 151 such as an UV curable film or wax may be formed to bond the support substrate 153. The support substrate 153 may be temporarily bonded to the first and second electrode pads 145 and 146 to support structures, formed by the previous processes, during following processes.

Referring to FIG. 16J, the substrate 101 may be removed to expose the first conductive semiconductor layer 113. In this case, portions of the first insulating layer 121 between the three light emitting regions C1, C2, and C3 may be exposed together. When the substrate 101 is a transparent substrate such as a sapphire substrate, the substrate 101 may be separated from the light emitting regions C1, C2, and C3 by a laser lift-off (LLO) process. A laser used in the LLO process may be at least one of a 193 nm excimer laser, a 248 nm excimer laser, a 308 nm excimer laser, a Nd:YAG laser, a He—Ne laser, and an Ar ion laser. In addition, when the substrate 101 is an opaque substrate such as a Si substrate, the substrate 101 may be removed by grinding, polishing, dry etching, or combinations thereof.

Sequentially, after the removal of the substrate 101, an uneven pattern (P) may be formed on an upper surface of the first conductive semiconductor layer 113 to increase light emission efficiency, and the upper surface may form a light emitting surface. The uneven pattern (P) may be formed by, for example, a wet etching process using a solution containing KOH, NaOH, or the like, or a dry etching process using an etching gas containing a $BCl_3$ gas, or the like.

The first insulating layer 121 insulating the first light emitting region C1 having a first width W1, the second light emitting region C2 having a second width W2, and the third light emitting region C3 having a third width W3, may be exposed.

Thus, a plurality of light emitting devices LC (see FIG. 16K) whose light emitting surfaces having the uneven pattern (P) are exposed may be formed on the support substrate 153 in an array form. Each of the light emitting devices LC may have three light emitting regions C1, C2, and C3 (refer to FIG. 16K). Here, FIG. 16K illustrates a portion of the support substrate 153.

Referring to FIGS. 16L and 16M, film strips 10s may be bonded to the plurality of light emitting devices LC formed on the support substrate 153 in the array form. The film strips 10s may be bonded to the light emitting devices LC so that a section of each of the film strips 10s may face the upper surface of each of the light emitting devices LC, the light emitting surface. In this case, a plurality of light emitting regions C1, C2, and C3 and a plurality of wavelength conversion regions 13as, 13bs, and 13cs may be arranged to correspond to each other, respectively. In other words the light emitting region C1 may correspond to the wavelength conversion region 13as, and the light emitting region C2 may correspond to the wavelength conversion region 13bs, etc. In the process of bonding the film strip 10s to a light emitting structure, the base film 11 and the protective film 19 may be removed.

Referring to FIG. 16N, a process of cutting the film strip 10s and the light emitting devices LC into individual light emitting device units may be finally performed. The present cutting process may be performed in, for example, a manner of removing the support substrate 153, bonding an adhesive tape, and cutting the film strip 10s and the light emitting devices LC with a blade.

Such processes may result in chip scale light emitting device packages in which a light emitting device may include a partition structure and wavelength conversion layers provided thereon.

According to an example embodiment as described above, a method of manufacturing a light emitting device package may simplify a method of manufacturing a compact light emitting device package that may emit various colors, thus reducing a manufacturing time and lowering production costs.

In addition, according to an example embodiment, a light emitting device package as a chip scale package obtained through a wafer level package process may have substantially the same size as a semiconductor light emitting device, an LED chip. Thus, when the light emitting device package is used as a lighting device or the like, light having a high intensity per unit area may be obtained, and when the light emitting device package is used as a display panel, a pixel size and a pixel pitch of the display panel may be reduced. In addition, since all of the processes are performed on the wafer level, the light emitting device package may be suitable for mass production.

Figure 17:
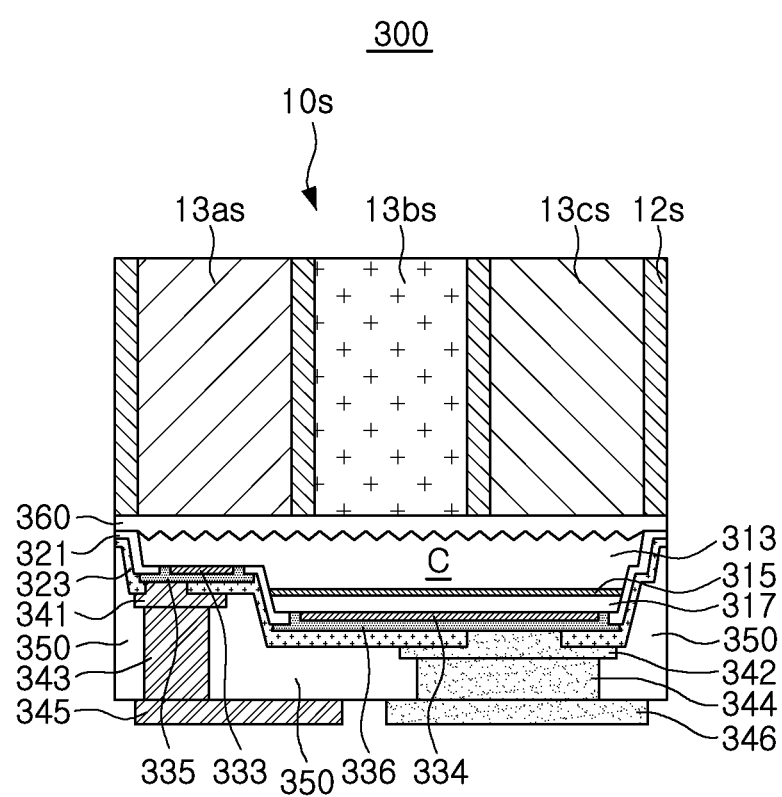
FIG. 17 is a cross-sectional view of a light emitting device package manufactured according to an example embodiment.

FIG. 17 is a cross-sectional view of a light emitting device package manufactured according to an example embodiment.

A light emitting device package 300 illustrated in FIG. 17 may be formed by bonding the film strip 10s illustrated in FIG. 2 to a light emitting surface of a light emitting device having a single light emitting region.

Referring to FIG. 17, the light emitting device package 300 may include a single light emitting region C, a first insulating layer 321, a second insulating layer 323, a first contact electrode 333, a first connection electrode 335, a first plating layer 341, a third plating layer 343, a first electrode pad 345, a second contact electrode 334, a second connection electrode 336, a second plating layer 342, a fourth plating layer 344, a second electrode pad 346, a molding 350, wavelength conversion regions 13as, 13bs, and 13cs, and light blocking regions 12s.

In more detail, the light emitting device package 300 may include a light emitting structure including a first conductive semiconductor layer 313, an active layer 315, and a second conductive semiconductor layer 317. The light emitting structure may have a first surface provided by the second conductive semiconductor layer 317 and a second surface provided by the first conductive semiconductor layer 313 and provided on an opposite side of the first surface. The second surface of the light emitting structure may be a light emitting surface. The first insulating layer 321 may extend from the first surface to the second surface along a lateral surface of the light emitting structure. A surface of the first insulating layer 121 may be co-planar with the second surface.

The light emitting device package 300 may include the first connection electrode 335 connected to the first conductive semiconductor layer 313, the first contact electrode 333 disposed in a space between the first conductive semiconductor layer 313 and the first connection electrode 335, and the first electrode pad 345 connected to the first connection electrode 335 through the first plating layer 341 and the third plating layer 343. The light emitting device package 300 may include the second connection electrode 336 connected to the second conductive semiconductor layer 317, the second contact electrode 334 disposed in a space between the second conductive semiconductor layer 317 and the second connection electrode 336, and the second electrode pad 346 connected to the second connection electrode 336 through the second plating layer 342 and the fourth plating layer 344. The first electrode pad 345 and the second electrode pad 346 may also be disposed on the first surface of the light emitting structure.

The first conductive semiconductor layer 313 and the second conductive semiconductor layer 317 may be an n-type semiconductor layer and a p-type semiconductor layer, respectively. Conversely, according to an example embodiment, the first conductive semiconductor layer 313 and the second conductive semiconductor layer 317 may be a p-type semiconductor layer and an n-type semiconductor layer, respectively.

The light emitting device package 300 may include the molding 350 provided below the light emitting region C and surrounding the first to fourth plating layers 341 to 344. The light emitting device package 300 may include the wavelength conversion regions 13*as*, 13*bs*, and 13*cs* provided on the light emitting region C to convert a wavelength of light emitted from the light emitting region C, and the light blocking regions 12*s* disposed on both sides of each of the wavelength conversion regions 13*as*, 13*bs*, and 13*cs*.

The wavelength conversion regions 13*as*, 13*bs*, and 13*cs* and the light blocking regions 12*s* may be formed by bonding the film strip 10*s* or 20*s* having a certain width T illustrated in FIG. 3 or 11 to the light emitting region C, and cutting the film strip 10*s* or 20*s* and the light emitting structure into individual light emitting device units. This is only an example, and the present inventive concept is not limited thereto. A bonding layer 360 may be formed to bond the film strip 10*s*.

For example, when the light emitting region C emits UV light, a first wavelength conversion region 13*as* may include a red phosphor, a second wavelength conversion region 13*bs* may include a green phosphor, and a third wavelength conversion region 13*cs* may include a blue phosphor.

In a different manner, according to an example embodiment, when the light emitting region C emits blue light, the first wavelength conversion region 13*as* may include a red phosphor, the second wavelength conversion region 13*bs* may include a green phosphor, and the third wavelength conversion region 13*cs* may include a green phosphor having a concentration lower than that the green phosphor included in the second wavelength conversion region 13*bs*. The green phosphor included in the third wavelength conversion region 13*cs* may contribute to adjusting CIE color coordinates of a light emitting device.

Figure 18:
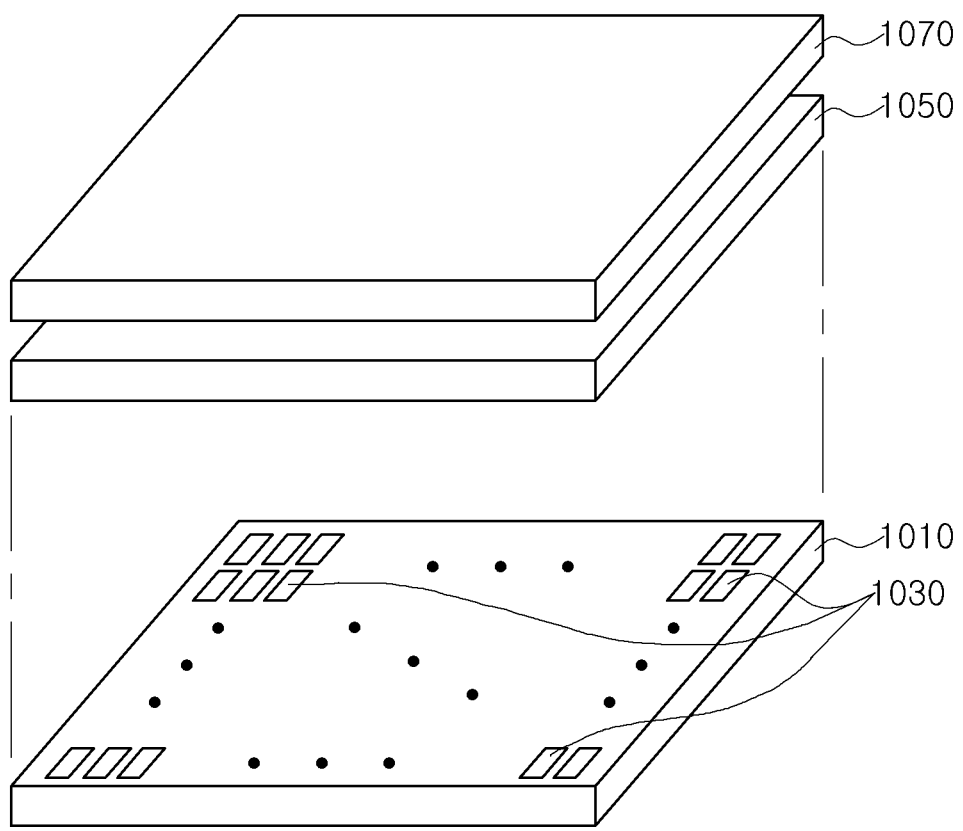
FIG. 18 is a schematic perspective view illustrating a display device including a light emitting device package according to an example embodiment.

FIG. 18 is a schematic perspective view illustrating a display panel including a light emitting device package according to an example embodiment.

Referring to FIG. 18, a display panel 1000 may include a circuit board 1010 including a driver circuit and a control circuit, pixels 1030 arranged on the circuit board 1010 in a plurality of rows and columns, a protective layer 1050, and a polarizing layer 1070. Each of the pixels 1030 may include a light emitting device package according to an example embodiment. In this case, a size and a pitch of each of the pixels 1030 may be reduced, and a high-resolution image may thus be displayed. For example, when the light emitting device package 100 described with reference to FIG. 15 is employed in each of the pixels 1030, three light emitting regions C1, C2, and C3 that may be independently operated may be provided as three sub-pixels. For example, three sub-pixels may form a single pixel 1030.

As set forth above, according to example embodiments, a method of forming a partition structure and a wavelength conversion region in manufacturing a compact light emitting device package that may implement various colors may be simplified, thus shortening a manufacturing time and a manufacturing cost.

While exemplary embodiments have been shown and described above, it will be apparent to those skilled in the art that modifications and variations could be made without departing from the scope of the present inventive concept as defined by the appended claims.

What is claimed is:

1. A method of manufacturing a light emitting device package, the method comprising:
    preparing a film strip comprising a plurality of light blocking regions and a plurality of wavelength conversion regions emitting lights having different wavelengths;
    preparing a plurality of light emitting devices, each of the plurality of light emitting devices comprising a plurality of light emitting regions emitting blue or UV lights and divided by an insulating layer;
    bonding the film strip to the plurality of light emitting devices so as to dispose the plurality of wavelength conversion regions on the plurality of light emitting regions in a one-to-one correspondence, and disposing the plurality of light blocking regions on the insulating layer; and
    cutting the film strip and the plurality of light emitting devices into individual device units,
    wherein the preparation of the film strip comprises:
    alternately forming a plurality of light blocking layers and a plurality of wavelength conversion layers emitting lights of different wavelengths on a base film; and
    cutting the plurality of light blocking layers and the plurality of wavelength conversion layers to a certain width.

2. The method of claim 1, wherein widths of the plurality of wavelength conversion regions are the same as widths of the plurality of light emitting regions.

3. The method of claim 1, wherein the at least one light blocking region comprises carbon black or a titanium dioxide ($TiO_2$).

4. The method of claim 1, wherein the film strip further comprises a plurality of reflectors, each of the plurality of reflectors disposed between adjacent ones of the plurality of light blocking regions and the plurality of wavelength conversion regions.

5. The method of claim 1, wherein the plurality of light emitting regions comprise three independently operated light emitting regions, and the plurality of wavelength conversion regions comprise wavelength conversion materials emitting red, green, and blue light, respectively.

6. The method of claim 1, wherein the plurality of light emitting regions comprise four independently operated light emitting regions, and the plurality of wavelength conversion regions comprise wavelength conversion materials emitting red, green, blue, and white light, respectively.

7. The method of claim 1, wherein each of the plurality of light emitting devices comprises a first pad commonly connected to the plurality of light emitting regions and a plurality of second pads provided in a one-to-one relationship with the plurality of light emitting regions to be respectively connected to the plurality of light emitting regions.

8. A method of manufacturing a light emitting device package, the method comprising:
  alternately forming a plurality of light blocking layers and a plurality of wavelength conversion layers on a base film and a plurality of reflector layers, each of the plurality of reflector layers provided between adjacent ones of the plurality of light blocking layers and the plurality of wavelength conversion layers;
  cutting the plurality of light blocking layers and the plurality of wavelength conversion layers having the plurality of reflector layers, to prepare a film strip comprising a plurality of light blocking regions and a plurality of wavelength conversion regions separated by a plurality of reflector regions;
  preparing a plurality of light emitting devices, each of the plurality of light emitting devices comprising at least one light emitting region;
  bonding the film strip to the plurality of light emitting devices to allow a section of the film strip to face light emitting surfaces of the plurality of light emitting devices; and
  cutting the film strip and the plurality of light emitting devices into individual device units.

9. The method of claim 8, wherein the at least one light emitting region comprises a plurality of light emitting regions, and the bonding of the film strip comprises aligning the plurality of light emitting regions and the plurality of wavelength conversion regions to correspond respectively to each other.

10. The method of claim 8, wherein the plurality of wavelength conversion regions comprise wavelength conversion materials emitting light having different wavelengths.

11. A method of manufacturing a light emitting device package, the method comprising:
  manufacturing, separately from a light emitting structure, a film strip comprising at least three wavelength conversion regions that are separated from one another by light blocking regions, the at least three wavelength conversion regions emitting lights having different wavelengths;
  bonding the film strip to the light emitting structure, such that the at least three wavelength conversion regions align to cover at least one light emitting region of the light emitting structure; and
  cutting the film strip bonded to the light emitting structure into individual device units,
  wherein the manufacture of the film strip comprises:
  alternately forming a plurality of first light blocking layers and a plurality of stripe patterns perpendicular to the plurality of first light blocking layers on a base film;
  wherein each of the plurality of stripe patterns comprise a wavelength conversion layer and a second light blocking layer, and the plurality of stripe patterns extend in a single direction and the wavelength conversion layer of each of the plurality of stripe patterns emits light having different wavelengths from each other; and
  cutting the plurality of stripe patterns and the plurality of first light blocking layers in a direction perpendicular to the single direction.

12. The method of claim 11, wherein the at least one light emitting region comprises a plurality of light emitting regions, and wherein wavelength conversion region widths are the same as light emitting region widths.

13. The method of claim 11, wherein light blocking region widths are smaller than wavelength conversion region widths.

* * * * *